United States Patent [19]

Kasa et al.

[11] Patent Number: 5,179,536
[45] Date of Patent: Jan. 12, 1993

[54] SEMICONDUCTOR MEMORY DEVICE HAVING MEANS FOR REPLACING DEFECTIVE MEMORY CELLS

[75] Inventors: Yasushi Kasa, Kawasaki; Yoshihiro Takemae, Tokyo; Masanori Nagasawa, Kamakura; Yuji Arayama, Kawasaki; Akira Terui, Sagamihara; Sunao Araki, Kawasaki, all of Japan

[73] Assignees: Fujitsu Limited, Kawasaki; Fujitsu VLSI Limited, Kasugai, both of Japan

[21] Appl. No.: 794,705

[22] Filed: Nov. 20, 1991

Related U.S. Application Data

[63] Continuation of Ser. No. 471,762, Jan. 29, 1990, abandoned.

[30] Foreign Application Priority Data

| Jan. 31, 1989 | [JP] | Japan | 1-21337 |
| Feb. 9, 1989 | [JP] | Japan | 1-30435 |
| Feb. 9, 1989 | [JP] | Japan | 1-30436 |
| Feb. 10, 1989 | [JP] | Japan | 1-31484 |
| Feb. 10, 1989 | [JP] | Japan | 1-31561 |
| Feb. 10, 1989 | [JP] | Japan | 1-31562 |

[51] Int. Cl.[5] ............................................. G11C 7/00
[52] U.S. Cl. ........................................ 365/200; 371/10.2
[58] Field of Search .................. 365/200, 230.03; 371/10.1, 10.2, 10.3

[56] References Cited

U.S. PATENT DOCUMENTS

| 4,376,300 | 3/1983 | Tsang | 365/200 |
| 4,399,372 | 8/1983 | Tanimoto et al. | 365/200 X |
| 4,473,895 | 9/1984 | Tatematsu | 365/200 |

Primary Examiner—Joseph A. Popek
Attorney, Agent, or Firm—Armstrong & Kubovcik

[57] ABSTRACT

A semiconductor memory device comprises a first memory comprising memory cells for prestoring fixed data, a decoder for decoding an input address and for reading out a fixed data from the first memory based on a decoded input address, a second memory for storing a data identical to that prestored in a defective memory cell of the first memory, where the second memory comprising programmable non-volatile memory cells, a discriminating part including a third memory for storing a redundant address of each defective memory cell of the first memory for discriminating whether or not the input address coincides with the redundant address and for outputting a discrimination signal when the input address coincides with the redundant address, and a selecting part supplied with data read out from the first and second memories for normally outputting the data read out from the first memory and selectively outputting the data from the second memory when the discrimination signal is received from the discriminating part.

22 Claims, 41 Drawing Sheets

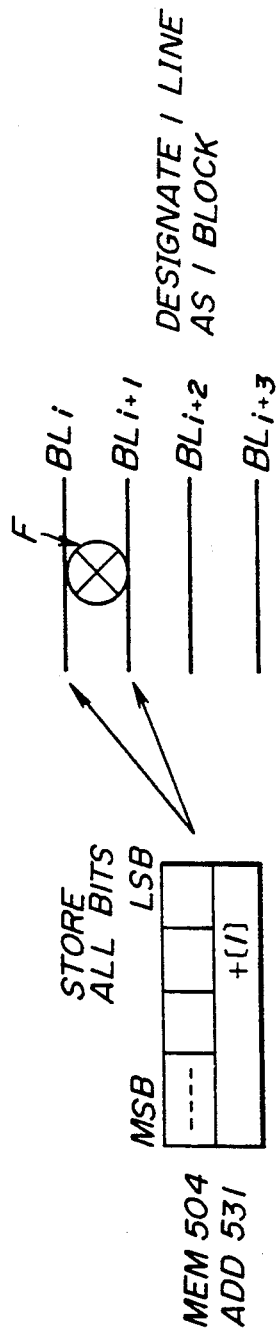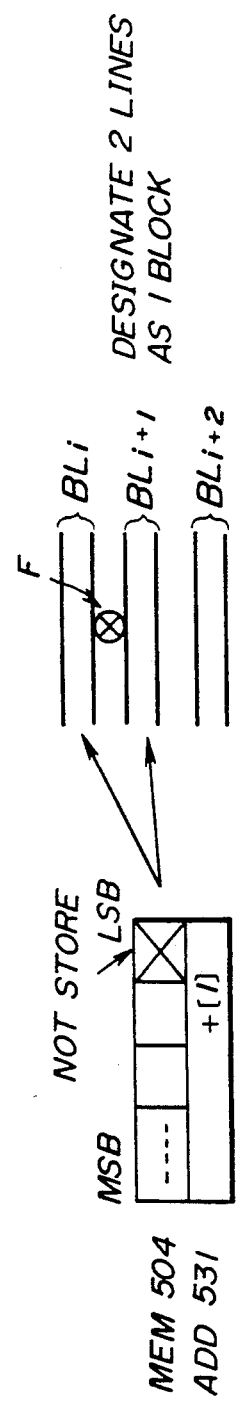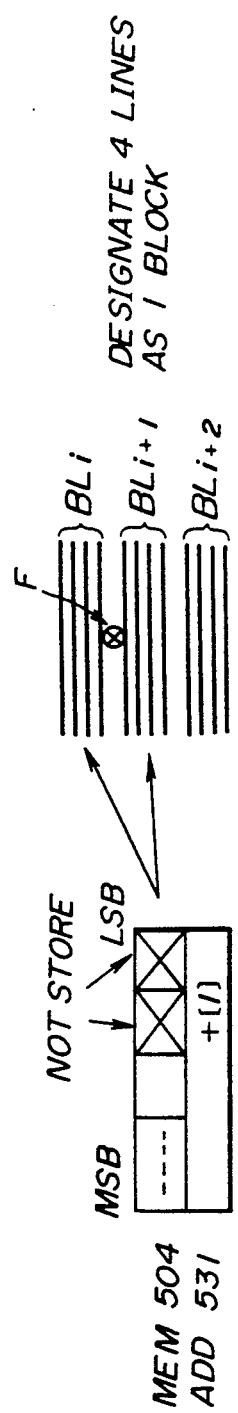

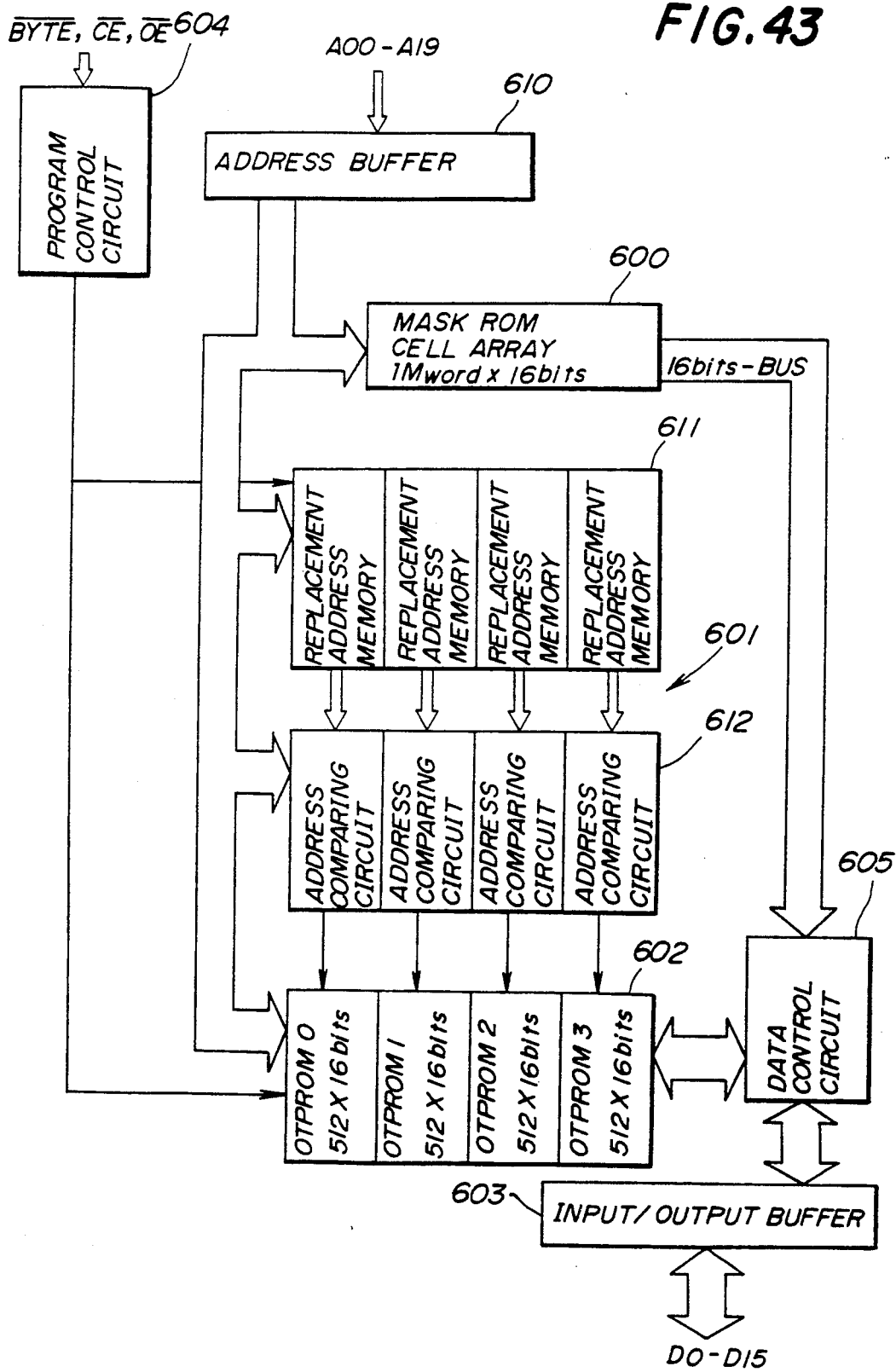

FIG. 44

| CASE | FUNCTION | BYTE | CE | OE | ADDRESS | | | | | DATA |
|------|----------|------|-----|-----|---------|---|---|---|---|------|
| | | | | | A19-A9 | A8 | A7-A6 | A5-A0 | | D15-D0 |
| 1 | WORD LINE REPLACEMENT ADDRESS MEMORY PROGRAMMING | VPP | H | H | REPLACEMENT PORTION ADDRESS | X | SELECT | DON'T CARE | | ALL "H" |
| 2 | OTPROM DATA PROGRAMMING | VPP | L | H | REPLACEMENT PORTION ADDRESS | OTPROM ADDRESS | | | | OTPROM PROGRAM DATA |
| 3 | WRITE PROTECT COMMAND | VPP | H | H | DON'T CARE | X | SELECT | DON'T CARE | | ALL "L" |
| 4 | BIT LINE REPLACEMENT ADDRESS MEMORY PROGRAMMING | VPP | H | H | A19-A17 ADDRESS | DON'T CARE | SELECT | A4-A0 ADDRESS | | ONLY 1 BIT "H" |

FIG.45

| ADDRESS BITS | FUNCTION | WORD LINE DETECT | BIT LINE DETECT |
|---|---|---|---|
| A00<br>A01<br>A02<br>A03<br>A04 | 1/32<br>COLUMN | REDUNDANT MEMORY CELL SCAN ADDRESS | * DEFECTIVE ADDRESS (COLUMN) STORAGE |
| A05<br>A06<br>A07 | 1/8<br>WORD LINE GROUP | 256 X 16 bits | REDUNDANT MEMORY CELL SCAN ADDRESS |
| A08<br>A09<br>A10<br>A11 | 1/512<br>ROW | * DEFECTIVE ADDRESS | |
| A12<br>A13<br>A14<br>A15<br>A16 | | (ROW) + STORAGE | 4096 X 1 bits |
| A17<br>A18<br>A19 | 1/8<br>CELL BLOCK | | DEFECTIVE + ADDRESS (CELL BLOCK) STORAGE |

SEMICONDUCTOR MEMORY DEVICE HAVING MEANS FOR REPLACING DEFECTIVE MEMORY CELLS

This application is a continuation of application Ser. No. 471,762 filed Jan. 29, 1990, now abandoned.

BACKGROUND OF THE INVENTION

The present invention generally relates to semiconductor memory devices, and more particularly to a semiconductor memory device such as a mask read only memory (ROM) which is capable of replacing defective memory cells.

Data written in a mask ROM is fixed during the production process when an exposure is made using a photomask or an exposure is made directly without the use of the photomask. The mask ROM is suited for use in a case where there is a need to produce a large number of ROMs which store identical fixed data such as character font data. In addition, the memory cell structure of the mask ROM is simple and the size of the memory cells can easily be reduced. For this reason, the design rule is reduced and the chip size is increased recently to further improve the integration density.

On the other hand, defective memory cells increase as the integration density becomes high. As a result, there are problems in that the yield of the mask ROM becomes poor and the mask ROM becomes expensive.

Conventionally, there are methods of replacing the defective memory cells by using the so-called redundant memory cells in place of the defective memory cells, and these methods are generally employed in a dynamic random access memory (DRAM), a static RAM (SRAM) and an erasable programmable ROM (EPROM). FIG. 1 shows an essential part of an example of the DRAM which employs such a conventional method of replacing the defective memory cells.

In FIG. 1, the DRAM comprises an address buffer 1, a redundancy discriminating circuit 2, a control circuit 3, a DRAM memory cell array 4, a defective memory cell array 4a which includes defective memory cells and corresponds to one row, for example, a redundant memory cell array 5 which corresponds to one row, a redundant memory cell array 6 which corresponds to one column, a row decoder 7, a column decoder 8, a write/read amplifier 9, and an input/output circuit 10.

The redundancy discriminating circuit 2 detects whether or not an input address coincides with a preset redundant address of the defective memory cell array 4a, and makes the control circuit 3 output a control signal $S_R$ or $S_C$ when the input address coincides with the redundant address. It will be assumed for the sake of convenience that the control circuit 3 outputs the control signal $S_R$, that is, the defective memory cell array 4a is substituted by the redundant memory cell array 5. In this case, the write/read amplifier 9 writes data in or reads data from the redundant memory cell array 5. In other words, the defective memory cells corresponding to one row is substituted by the redundant memory cells to relieve the defective memory cells, thereby improving the yield of the DRAM.

However, this method of replacing the defective memory cells of the DRAM cannot be applied to the mask ROM because the fixed data are written into the mask ROM during the production process. In the case of the mask ROM, the fixed data cannot be written into the redundant memory cells after the defective memory cells are found. In order to overcome this problem, it is conceivable to use redundant memory cells having a PROM structure. In this conceivable case, it is possible to freely write the fixed data into the redundant memory cells having the PROM structure after the defective memory cells are found.

The yield of the mask ROM can be improved according to the above conceivable method which uses the redundant memory cells having the PROM structure. But on the other hand, the integration density of the mask ROM becomes poor for the following reason. That is, the cell area of the mask ROM versus the cell area of the PROM is generally in the order of 1:30, and the cell area of the PROM is extremely large compared to that of the mask ROM. For this reason, when word lines and bit lines are used in common between the mask ROM and the PROM and the mask ROM and the PROM coexist on the chip, the integration density of the mask ROM becomes determined by the cell area of the PROM. As a result, there are problems in that the advantageous features of the mask ROM cannot be utilized and the integration density of the mask ROM becomes poor.

SUMMARY OF THE INVENTION

Accordingly, it is a general object of the present invention to provide a novel and useful semiconductor memory device in which the problems described above are eliminated.

Another and more specific object of the present invention is to provide a semiconductor memory device comprising first memory means comprising memory cells for prestoring fixed data, decoder means for decoding an input address and for reading out a fixed data from the first memory means based on a decoded input address, second memory means for storing a data identical to that prestored in a defective memory cell of the first memory means, where the second memory means comprises programmable non-volatile memory cells, discriminating means including third memory means for storing a redundant address corresponding to each defective memory cell of the first memory means for discriminating whether or not the input address coincides with the redundant address and for outputting a discrimination signal when the input address coincides with the redundant address, and selecting means supplied with data read out from the first and second memory means for normally outputting the data read out from the first memory means and selectively outputting the data from the second memory means when the discrimination signal is received from the discriminating means. According to the semiconductor memory device of the present invention, it is possible to arrange the first and second memory means independently of each other, and it is thus possible to maintain the high integration density of the first memory means while replacing the defective memory cells by the redundant memory cells of the second memory means. Therefore, the yield of the semiconductor memory device can be improved considerably compared to the conventional semiconductor memory device, especially when the first memory means is a mask ROM.

Other objects and further features of the present invention will be apparent from the following detailed description when read in conjunction with the accompanying drawings.

BRIEF DESCRIPTION OF THE DRAWINGS

FIGS. 40A, 40B, 40C and 41 respectively are diagrams for explaining replacement of defective portions within the tenth embodiment;

FIG. 43 is a system block diagram showing an essential part of the eleventh embodiment;

FIG. 44 is a function table of the eleventh embodiment;

FIG. 45 shows an address assignment used in the eleventh embodiment;

DESCRIPTION OF THE PREFERRED EMBODIMENTS

Figure 1:
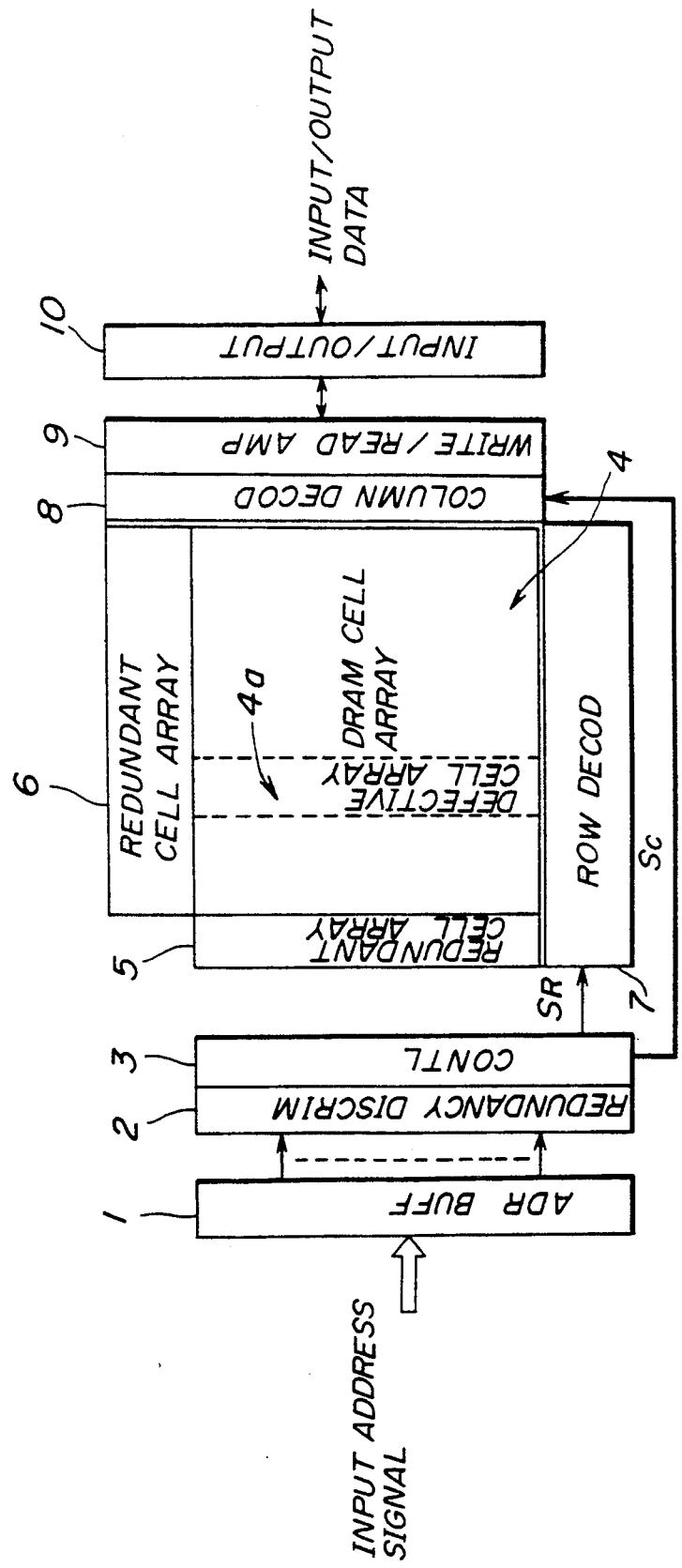
FIG. 1 is a system block diagram showing an essential part of an example of a conventional DRAM having means for replacing defective memory cells.
Figure 2:
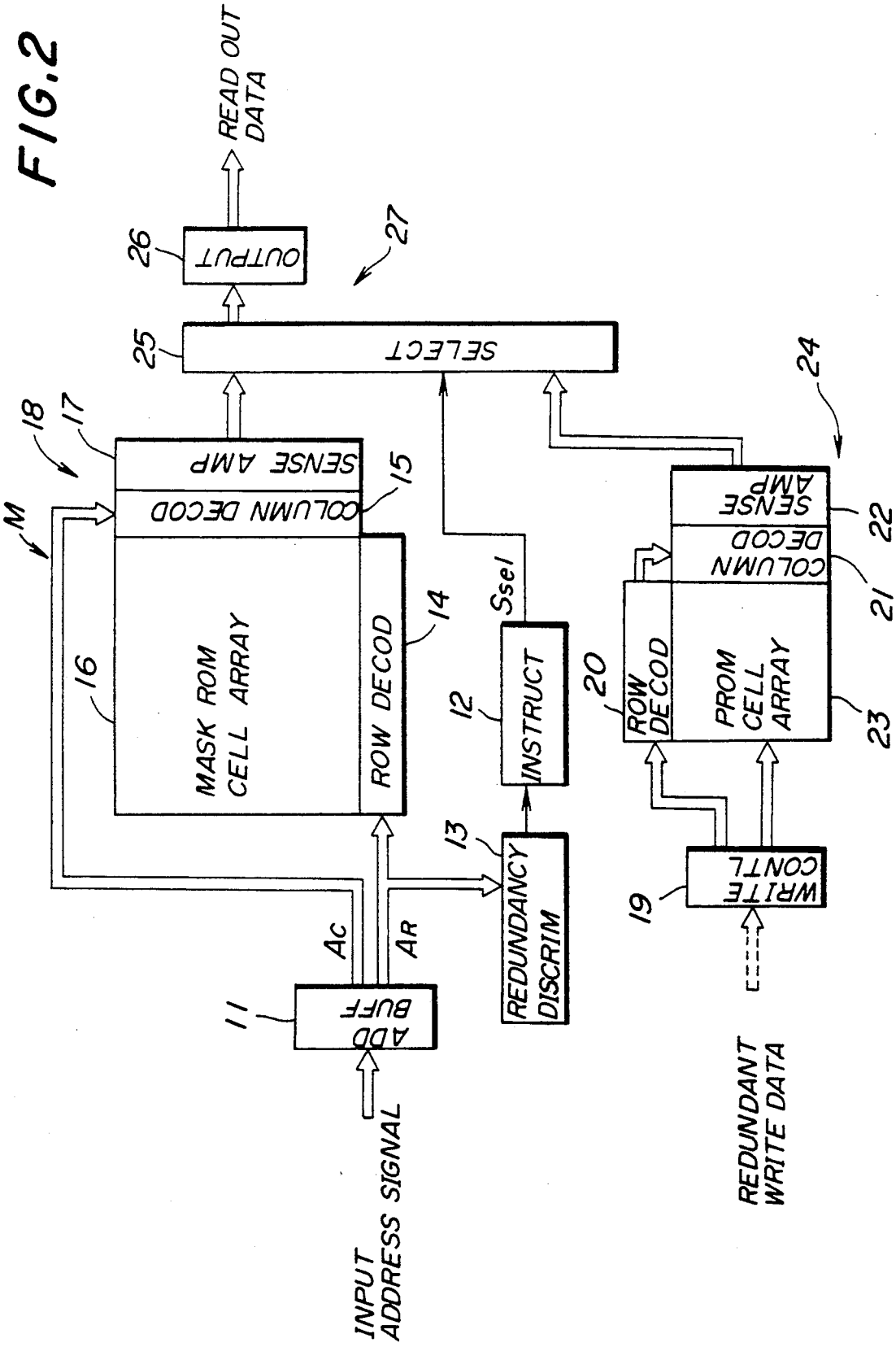
FIG. 2 is a system block diagram showing an essential part of a first embodiment of a semiconductor memory device according to the present invention.

FIG. 2 shows an essential part of a first embodiment of a semiconductor memory device according to the present invention. In this embodiment, the present invention is applied to a mask ROM M. The mask ROM M generally comprises an address buffer 11, an instructing means 12, a redundancy discriminating circuit 13, a first memory part 18, a second memory part 24, and a data output means 27. The first memory part 18 comprises a row decoder 14, a column decoder 15, a mask ROM cell array 16, and a sense amplifier 17. The second memory part 24 comprises a write control circuit 19, a row decoder 20, a column decoder 21, a sense amplifier 22, and a PROM cell array 23. The data output means 27 comprises a selecting circuit 25 and an output circuit 26.

The address buffer 11 receives an input address signal and outputs a row address signal $A_R$ and a column address signal $A_C$. The redundancy discriminating circuit 13 compares the row address signal $A_R$ and a redundant address signal which indicates a position of a preset defective memory cell, and controls the instructing means 12 to output a switch instruction signal $S_{sel}$ when the redundant address signal and the row address signal $A_R$ coincide. Normally, the selecting circuit 25 selects the data from the first memory part 18. But when the switch instruction signal $S_{sel}$ is received from the instructing means 12, the selecting circuit 25 selects the data from the second memory part 24. The output circuit 26 outputs to the outside of the semiconductor memory device M the data which is selectively output from the selecting circuit 25.

Fixed data are written into the mask ROM cell array 16 by an exposure using a photomask or by a direct exposure. When the semiconductor memory device M is tested and a defective memory cell is found within the mask ROM cell array 16, a redundant address signal which indicates the defective memory cell is set in the redundancy discriminating circuit 13. In addition, data which are identical to the data which are to be written into the row of memory cells including the defective memory cell are supplied to the write control circuit 19 so as to write the data into the PROM cell array 23.

When the input address signal coincides with the redundant address signal, the data from the second memory part 24 is selected by the selecting circuit 25 and output from the output circuit 26. In other words, the defective memory cell within the mask ROM cell array 16 is substituted by the PROM cell array 23 and the defective memory cells are relieved.

The first and second memory parts 18 and 24 are arranged at positions separated from each other, and the first and second memory parts 18 and 24 have independent memory functions. That is, the first and second memory parts 18 and 24 do not share word lines and/or bit lines in common, because the data from the first and second memory parts 18 and 24 are selected by the selecting circuit 25. Accordingly, the first memory part 18 which comprises an extremely large number of memory cells can be designed with a finest pattern, and the defective memory cells can be relieved to improve the yield without deteriorating the integration density of the semiconductor memory device M as a whole.

Although the substitution is made in the row direction in the description above, the substitution can of course be made in the column direction.

In addition, although the second memory part 24 has the PROM structure, various kinds of PROMs may be used for the second memory part 24. For example, the programming of the PROM may be made by cutting polysilicon with a large current or a laser beam, destroying a pn junction diode or a Schottky diode, or accumulating a charge at a floating gate of a metal oxide semiconductor field effect transistor (MOSFET). The only requirements of the PROM are that the memory is programmable and non-volatile.

It is possible to stop the operation of the second memory part 24 until the switch instruction signal $S_{sel}$ is output from the instructing means 12, that is, until the redundancy discrimination is made, and then stop the operation of the first memory part 18 when the switch instruction signal $S_{sel}$ is output from the instructing means 12. By taking these measures, it is possible to effectively minimize the power consumption of the semiconductor memory device.

Next, a description will be given of a second embodiment of the semiconductor memory device according to the present invention. In this embodiment, the present invention is applied to the substitution of a plurality of row or columns.

Figure 3:
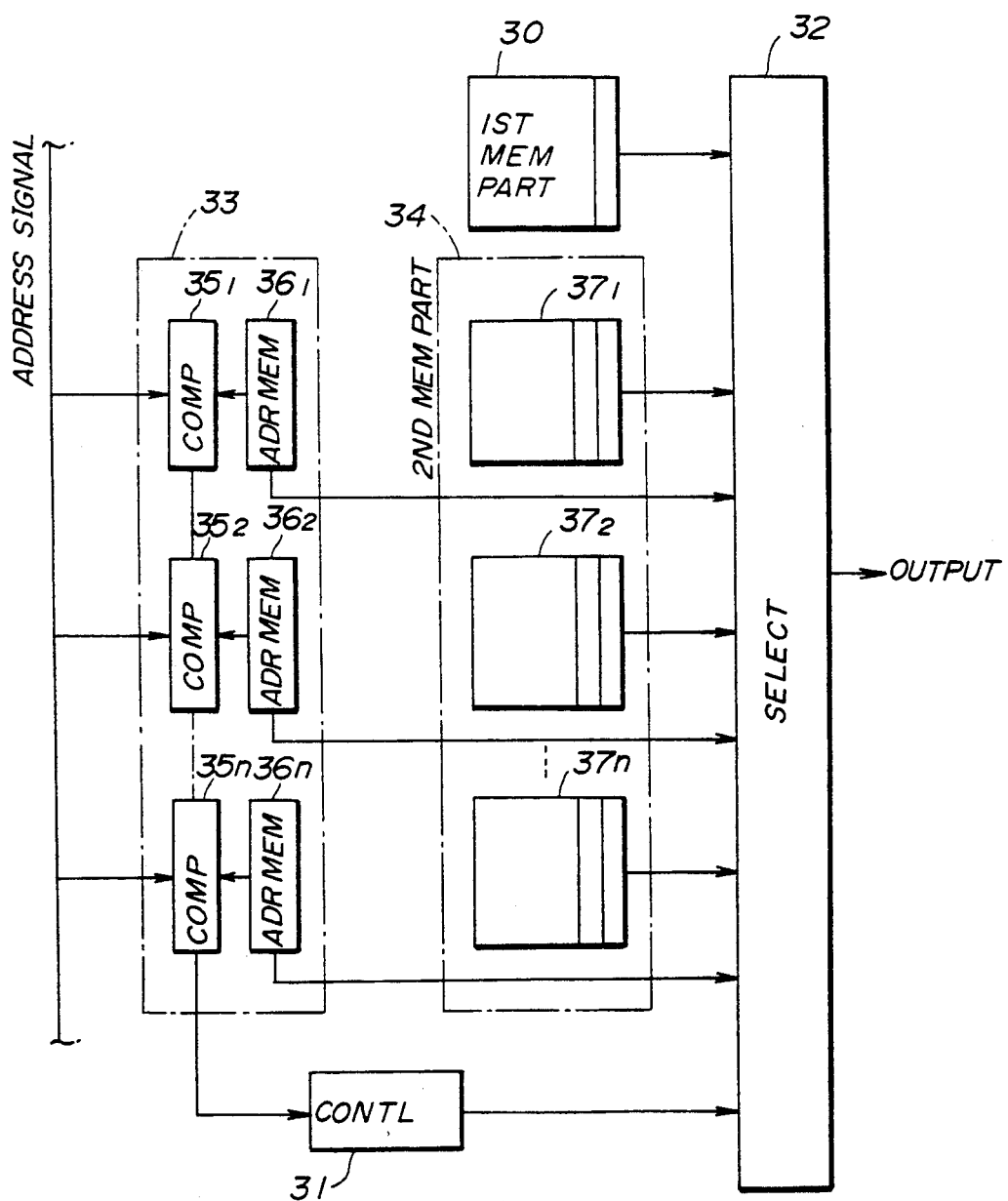
FIG. 3 is a system block diagram showing an essential part of a second embodiment of a semiconductor memory device according to the present invention.

FIG. 3 shows an essential part of the second embodiment. In FIG. 3, a semiconductor memory device comprises a first memory part 30 which has a mask ROM structure, a control circuit 31 which functions as the instructing means 12 of the first embodiment, a selecting circuit 32, a redundancy discriminating circuit 33, and a second memory part 34. The redundancy discriminating circuit 33 comprises n comparators $35_1$ through $35_n$ and n address memory parts $36_1$ through $36_n$. The second memory part 34 comprises n redundant circuits $37_1$ through $37_n$ which have a PROM structure.

The comparators $35_1$ through $35_n$ respectively compare the input address signal with each of the redundant address signals set in the address memory parts $36_1$ through $36_n$, and compared results are supplied to the control circuit 31. Hence, the control circuit 31 outputs a control signal which is dependent on the compared results The selecting circuit 32 selectively outputs the data from the first memory part 30 or the data from the second memory part 34 in response to the output control signal of the control circuit 31. As a result, a plurality of rows or columns are substituted in correspondence with the n redundant circuits $37_1$ through $37_n$ of the second memory part 34.

In a desirable mode of this embodiment, the selecting circuit 32 can also selectively output the redundant address signals from the address memory parts $36_1$ through $36_n$. In this case, it is convenient in that the redundant address signals can be observed outside the chip when testing (evaluating) the semiconductor memory device.

Conventionally, the input address signal is successively changed and the coincidence signal is output to the outside of the chip when the input address signal coincides with the redundant address signal. For this reason, there is a need to provide a circuit for successively changing the input address signal, a circuit for detecting the coincidence signal and a circuit for reading the content of the address signal when the coincidence signal is output. As a result, there are problems in that the circuit structure of the testing device becomes complex and it take time to read the content of the address signal.

But according to this embodiment, the redundant address signal can be observed as it is outside the chip. Hence, the circuit structure of the testing device does not become complex.

Figure 4:
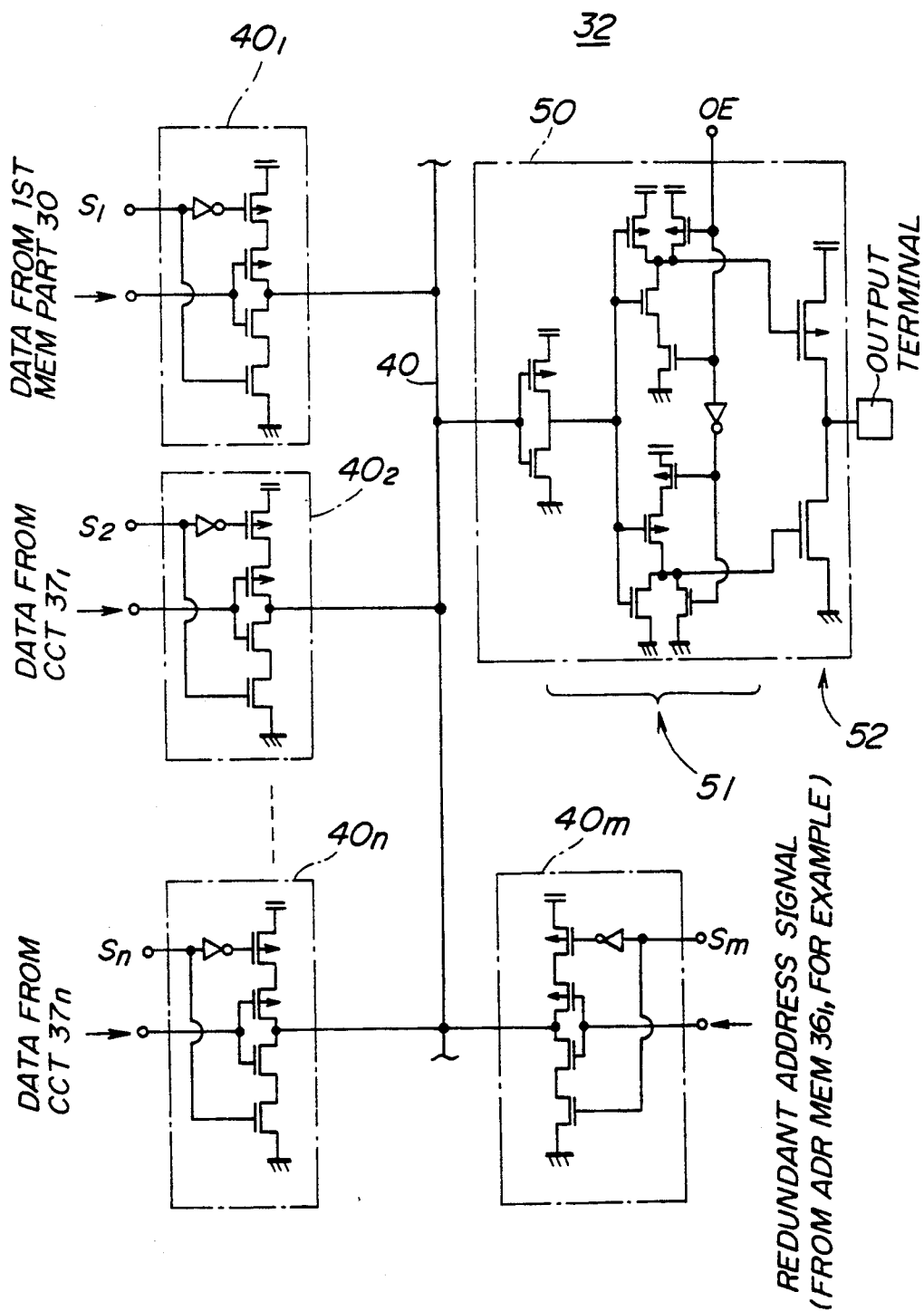
FIG. 4 is a circuit diagram showing an embodiment of a data output means of the second embodiment.

FIG. 4 shows an embodiment of the selecting circuit 32 shown in FIG. 3. The selecting circuit 32 employs a bus line system. That is, a plurality of 3-state buffers $40_1$ through $40_m$ are connected to a common bus line 40, and the data from the first and second memory parts 30 and 34 and the redundant address signal from the address memory parts $36_1$ through $36_n$ are supplied to the 3-state buffers $40_1$ through $40_m$. One of the 3-state buffers $40_1$ through $40_m$ is turned ON responsive to control signals $S_1$ through $S_m$. An output circuit 50 comprises an output buffer part 51 which operates responsive to an output enable signal OE and an output transistor part 52.

Figure 5:
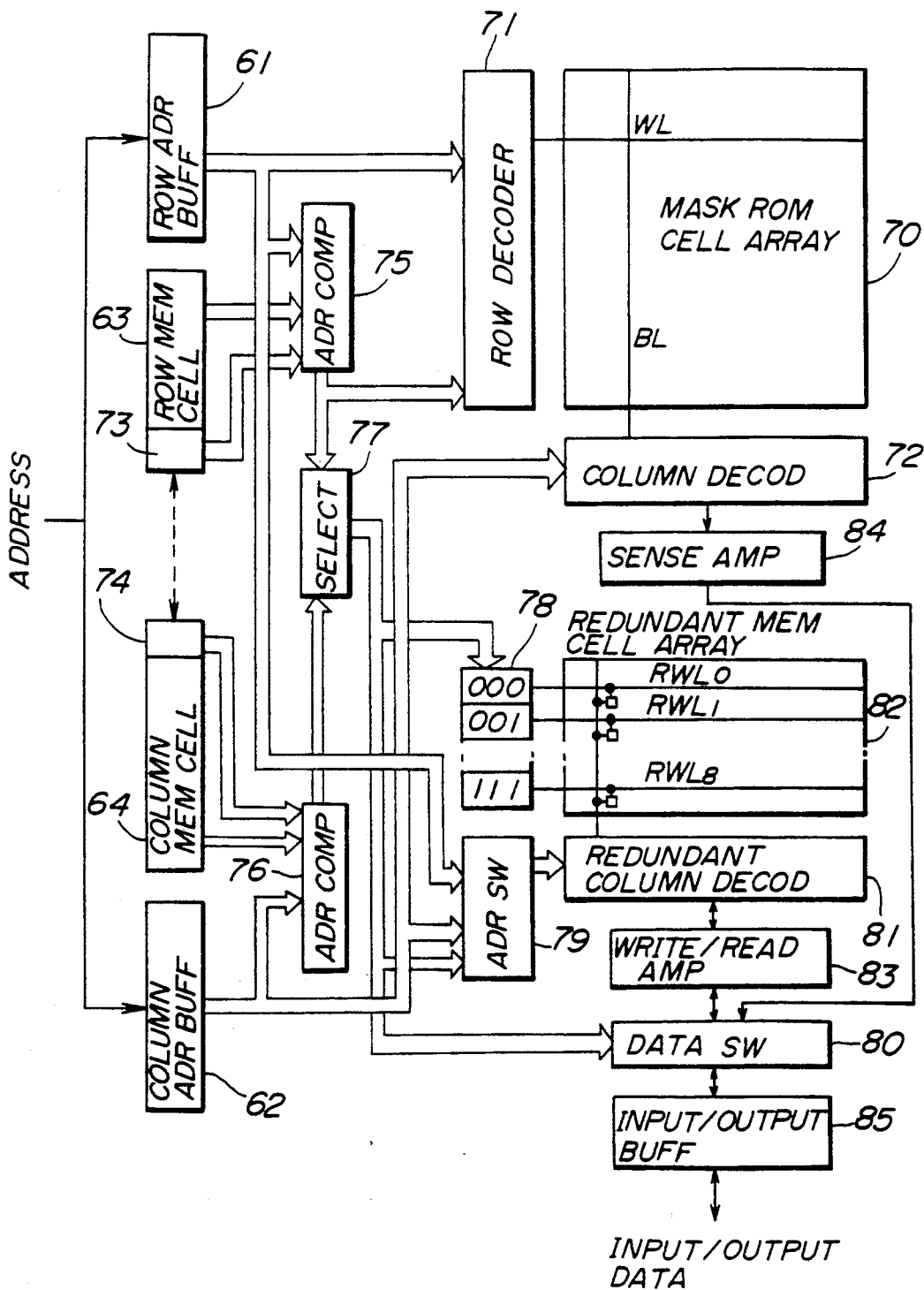
FIG. 5 is a system block diagram showing an essential part of a third embodiment of the semiconductor memory device according to the present invention.

Next, a description will be given of a third embodiment of the semiconductor memory device according to the present invention, by referring to FIG. 5. The semiconductor memory device shown in FIG. 5 comprises a row address buffer 61, a column address buffer 62, a defective address row memory cell 63, a defective address column memory cell 64, a mask ROM cell array 70, a row decoder 71, a column decoder 72, redundancy designating cells 73 and 74, address comparing circuits 75 and 76, a selecting circuit 77, a redundant row decoder 78, an address switch circuit 79, a data switch circuit 80, a redundant column decoder 81, a redundant memory cell array 82, a write/read amplifier 83, a sense amplifier 84, and an input/output buffer 85.

The redundancy designating cells 73 and 74 are respectively provided adjacent the defective address row memory cell 63 the defective address column memory cell 64. For example, when replacing the row of the mask ROM cell array 70, the redundancy designating cell 73 supplies a row replacing instruction to the address comparing circuit 75, and at the same time, the redundancy designating cell 73 supplies a column replacement prohibit signal to the redundancy designating cell 74. Therefore, only the row of the mask ROM cell array 70 is relieved in this case.

On the other hand, when replacing the column of the mask ROM cell array 70, the redundancy designating cell 74 supplies a column replacing instruction to the address comparing circuit 76, and at the same time, the redundancy designating cell 74 supplies a row replacement prohibit signal to the redundancy designating cell 73. Therefore, only the column of the mask ROM cell array 70 is relieved in this case.

Output signals of the address comparing circuits 75 and 76 are supplied to the selecting circuit 77 which selects the defective row or column which is to be replaced. A select instruction output from the selecting circuit 77 is supplied to the redundant row decoder 78, the address switch circuit 79 and the data switch circuit 80. Based on the select instruction from the selecting circuit 77, the address switch circuit 79 switches and supplies the address of the row or column which is to be replaced to the redundant column decoder 81. The redundant cells of the redundant memory cell array 82 are decoded by the redundant column decoder 81 and the redundant row decoder 78. For example, an 8 row by 4K column PROM cell array is used for the redundant memory cell array 82. The data is written into and read out from the redundant memory cells of the redundant memory cell array 82 via the write/read amplifier 83.

On the other hand, the data read from the memory cell of the mask ROM cell array 70 is decoded by the row decoder 71 and the column decoder 72 and is supplied to the data switch circuit 80 via the sense amplifier 84. Based on the select instruction from the selecting circuit 77, the data switch circuit 80 selectively makes a switching so as to output the data from the redundant memory cell array 82 via the input/output buffer 85 or to input the data into the redundant memory cell array 82 via the input/output buffer 85.

In this embodiment, the redundant memory cell array 82 is also constituted by the PROM cell array. Hence, the redundant memory cell array 82 and its related decoder part can be arranged independently of the mask ROM cell array and its related decoder part, and the same effects can be obtained as in the case of the first and second embodiments.

But when replacing the row of the mask ROM cell array 70 in the third embodiment, the row defective address is prestored in the defective address row memory cell 63, the redundancy designating cell 73 supplies the row replacing instruction to the address comparing circuit 75, and the redundancy designating cell 73 supplies the column replacement prohibit instruction to the redundancy designating cell 74. A similar operation is carried out when replacing the column of the mask ROM cell array 70. For this reason, a circuit portion which is exclusively used for replacing the row and a circuit portion which is used exclusively for replacing the column coexist on the chip, and there is still room for improving the utilization efficiency of the chip area.

Figure 6:
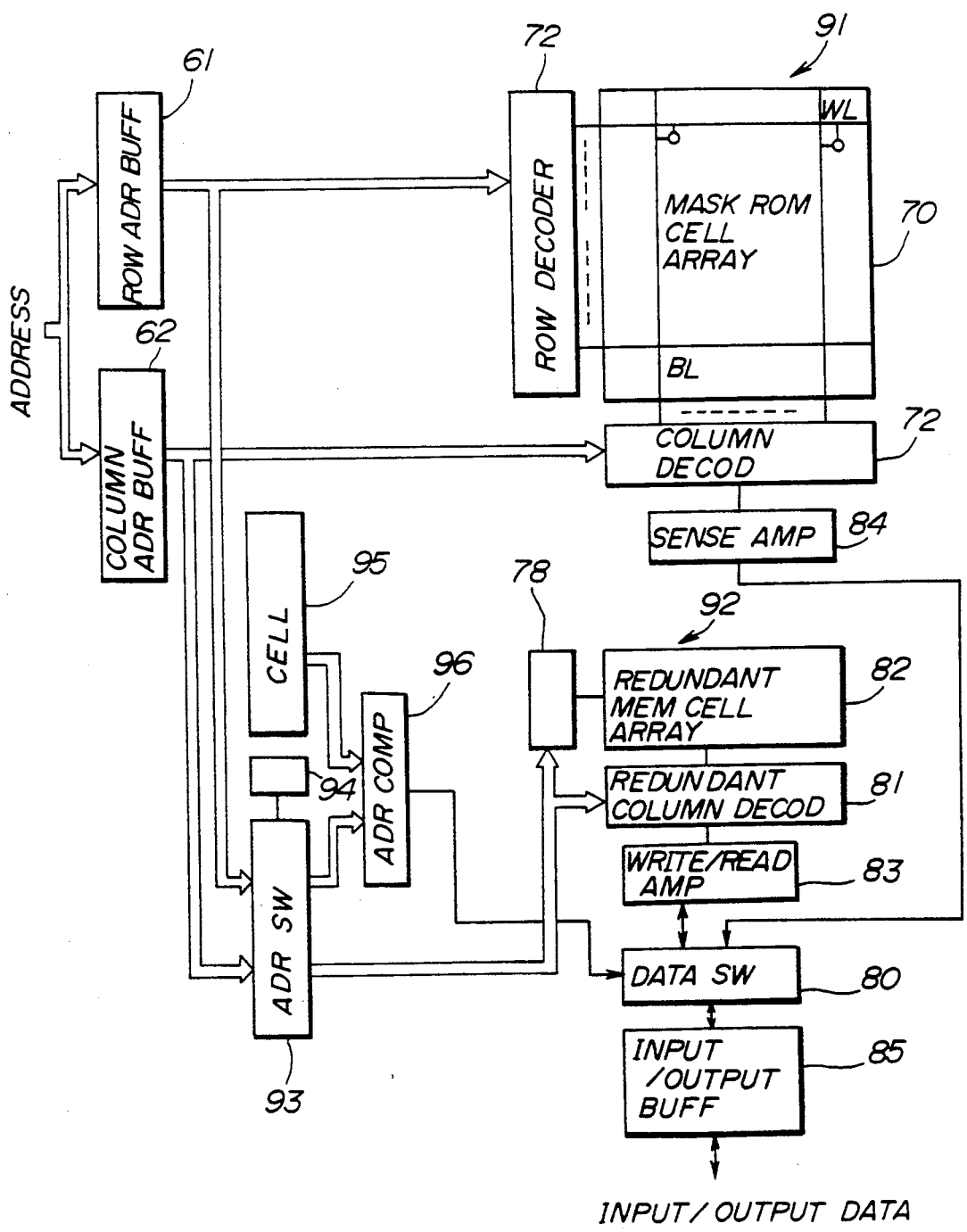
FIG. 6 is a system block diagram showing a fourth embodiment of the semiconductor memory device according to the present invention.

Next, a description will be given of a fourth embodiment of the semiconductor memory device according to the present invention in which the utilization efficiency of the chip area is improved. FIG. 6 shows an essential part of the fourth embodiment. In FIG. 6, those parts which are essentially the same as those corresponding parts in FIG. 5 are designated by the same reference numerals, and a description thereof will be omitted.

In FIG. 6, the row address buffer 61, the column address buffer 62, the mask ROM cell array 70, the row decoder 71, the column decoder 72 and the sense amplifier 84 constitute a first memory part 91. The redundant row decoder 78, the redundant column decoder 81, the redundant memory cell array 82 and the write/read amplifier 83 constitute a second memory part 92.

The fourth embodiment differs from the third embodiment in that the fourth embodiment does not have independent circuit portions for replacing the row and the column of the mask ROM cell array 70. The row and the column are replaced by use of an address switch circuit 93, a replacing direction memory cell 94, a defective address memory cell 95 and an address comparing circuit 96.

When the mask ROM cell array 70 includes a defective memory cell, the defective address memory 95 stores the address of the row or column which includes the defective memory cell as the defective address. When a defective memory cell exists in the row or column of the mask ROM cell array 70, the replacing direction memory cell 94 stores an information which designates the replacing direction. The input address signal is supplied to the address switch circuit 93 via the row address buffer 61 and the column address buffer 62. When the input address signal includes the defective address, the address switch circuit 93 selectively extracts an address for decoding to be used in the second memory part 92 and the address for discriminating the replacement of the defective cell in the first memory part 91 based on the information which designates the replacing direction and is obtained from the replacing direction memory cell 94.

Out of the input address signal, the address comparing circuit 96 compares the address which is selected by the address switch circuit 93 and the defective address which is prestored in the defective address memory 95, and supplies a switch instruction signal to the data switch circuit 80 when the two compared addresses coincide. The data switch circuit 80 normally selects and supplies the fixed data from the mask ROM cell array 70 to the input/output buffer 85. On the other hand, the data switch circuit 80 selects and supplies the data from the redundant memory cell array 82 to the input/output buffer 85 when a comparison instruction signal is received from the address comparing circuit 46.

Figure 7:
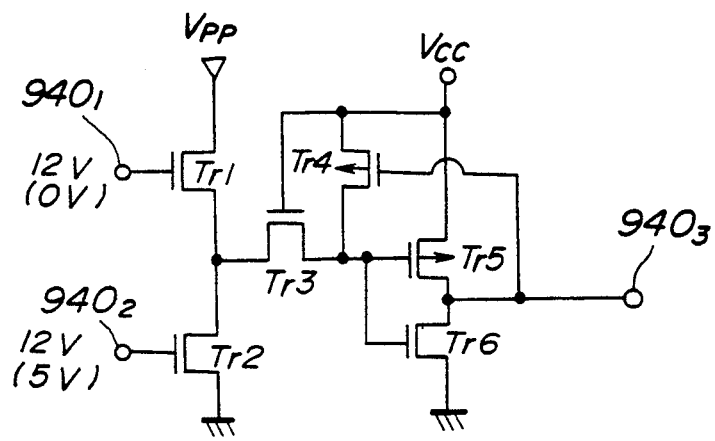
FIG. 7 is a circuit diagram showing an embodiment of a replacing direction memory cell shown in FIG. 6.

FIG. 7 shows an embodiment of the replacing direction memory cell 94. The replacing direction memory cell 94 comprises six transistors Tr1 through Tr6 which are connected as shown. Vcc denotes a power source voltage of 5 V, for example, and Vpp denotes a write voltage. For example, a voltage of 12 V is applied to terminals $940_1$ and $940_2$ in a write mode, and a voltage of 0 V and the power source voltage Vcc (5 V) are respectively applied to the terminals $940_1$ and $940_2$ in a read mode. In the read mode, the read out data, that is, the information which designates the replacing direction, is obtained from a terminal $940_3$ and is supplied to the address switch circuit 93.

Figure 8:
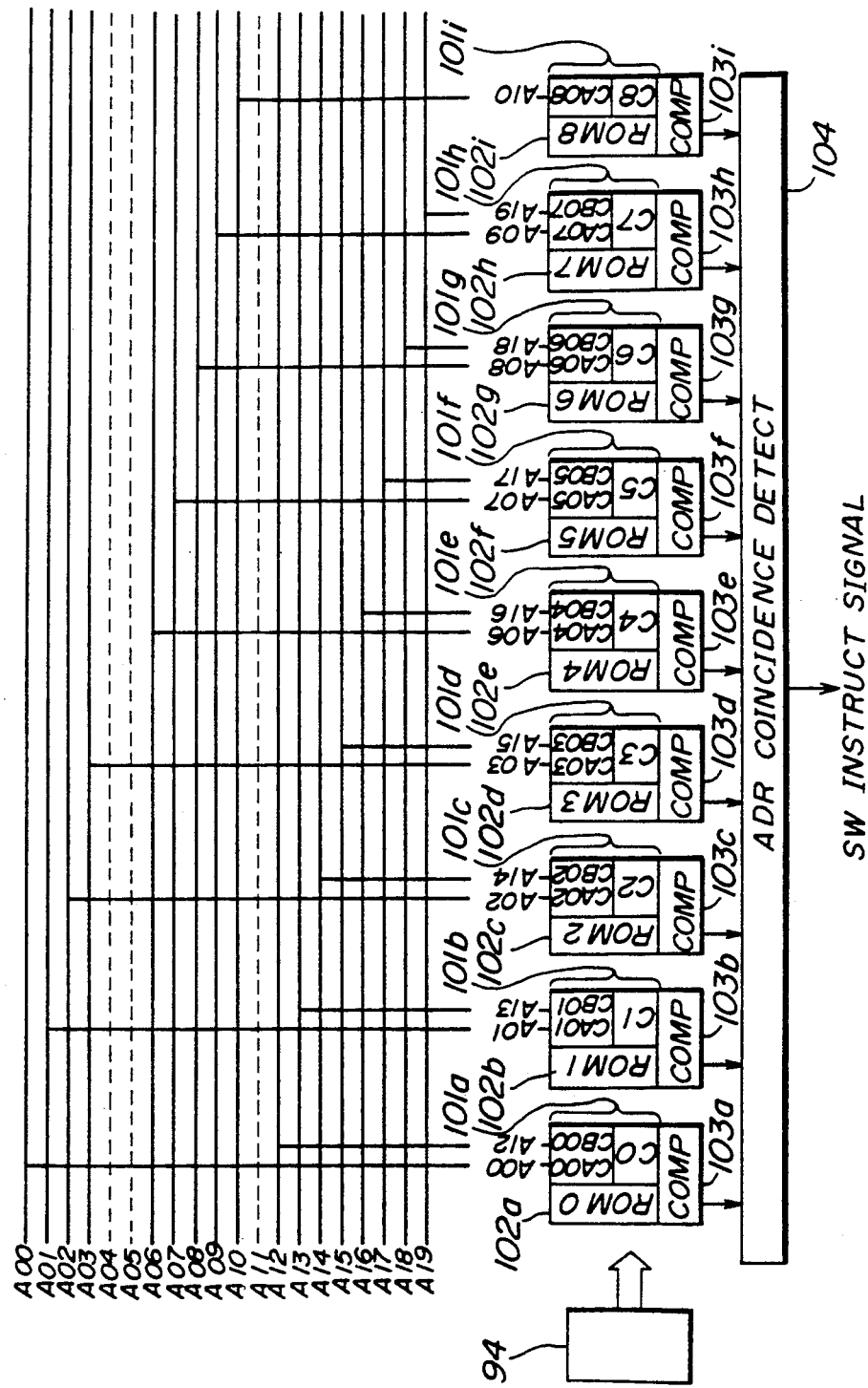
FIG. 8 is a circuit diagram showing a portion of the fourth embodiment for carrying out a switch instruction process.

FIG. 8 shows a circuit portion of the fourth embodiment for carrying out a switch instruction process. The switch instruction process refers to a process which is carried out from a time when the input address signal is received by the row address buffer 61 and the column address buffer 62 until a time when the switch instruction signal is output from the address comparing circuit 96.

In FIG. 8, A00 through A19 denote the input address (external address) bits, where A00 through A10 denote the row address bits and A11 through A19 denote the column address bits, for example. The row address bits A11 through A10 and the column address bits A11 through A19 are are supplied to the address switch circuit 93 via the row address buffer 61 and the column address buffer 62, respectively. FIG. 8 shows the circuit portion of the address switch circuit 93 which compares the input address and the defective address.

Switch circuits 101a through 101i correspond to the address switch circuit 93. For example, the switch circuit 101a replaces the address bits A00 and A12 by CA00 and CB00 which respectively indicate the word line replacing direction and the bit line replacing direction. The switch circuit 101a outputs one of CA00 and CB00 as CO based on the information from the replacing direction memory cell 94 which designates the replacing direction. Although the address numbers differ, the other switch circuits 101b through 101i operate similarly to the switch circuit 101a. Memory cells 102a through 102i correspond to the replacing direction memory cell 94 and respectively store the address bits of the defective address Comparators 103a through 103i and an address coincidence detecting circuit 104 correspond to the address comparing circuit 96. The comparators 103a through 103i compare the bits of the input address with the corresponding bits of the defective address. The address coincidence detecting circuit 104 outputs the switch instruction signal when all of the bits with respect to the row or column coincide with the corresponding bits of the defective address. For example, the defective address from the memory cell 102a and the output C0 of the switch circuit 101a are compared in the comparator 103a, and a coincidence signal is supplied from the comparator 103a to the address coincidence detecting circuit 104 when the two compared addresses coincide Similarly, the remaining bits of the input address with respect to the row or column are compared with the corresponding bits of the defective address in the comparators 103b through 103i.

First, the fixed data are written into the first memory part 91 by use of a photomask, and the fixed data are thereafter read from the first memory part 91 to check whether or not the fixed data are correctly written. When a defective memory cell is found in the mask ROM cell array 70 as a result of the check, the address of the row or column which includes the defective memory cell is set in the detective address memory cell 95. The information which designates the replacing direction is set in the replacing direction memory cell 94. Furthermore, the data which are identical to the data which are written into the memory cells of the row which includes the defective memory cell are supplied to the write/read amplifier 83 so as to write the data into the redundant memory cells of the second memory part 92.

The input address signal is supplied to the row decoder 71 and 72 via the respective row address buffer 61 and the column address buffer 62. The row or column address is selected by the address switch circuit 93 based on the information which designates the replacing direction and is obtained from the replacing direction memory cell 94. The address comparing circuit 96 compares the row or column address which is selected by the address switch circuit 93 and the defective address which is set in the defective address memory cell 95. When the two compared addresses coincide in the address comparing circuit 96, the data from the redundant memory cell array 82 is decoded by the redundant row decoder 78 and the redundant column decoder 81 and read out via the write/read amplifier 83. The read out data is selected by the data switch circuit 80 and is output via the input/output buffer 85. Accordingly, the defective memory cell within the mask ROM cell array 70 is replaced by the redundant memory cell within the redundant memory cell array 82.

In this embodiment, the defective address memory cell 95 is provided in a stage next to the address switch circuit 93. For this reason, when the defective row is to be replaced, for example, the portion of the input address corresponding to the defective row address is selected by the address switch circuit 93 and supplied to the address comparing circuit 96 for comparison with the defective address from the defective address memory cell 95 The defective column is replaced similarly as when replacing the defective row. Hence, only a single circuit portion is required to store the defective address and to make the address comparison, and the circuit structure of the circuit portion which replaces the defective memory cell by the redundant memory cell is simple. As a result, it is possible to realize a high integration density and improved yield by the replacement of the defective memory cell, without the need to provide a large chip area for the circuit portion which replaces the defective memory cell.

Of course, the second memory part 92 is not limited to the PROM structure, and it is possible to use any non-volatile programmable memory such as the EPROM.

Figure 9:
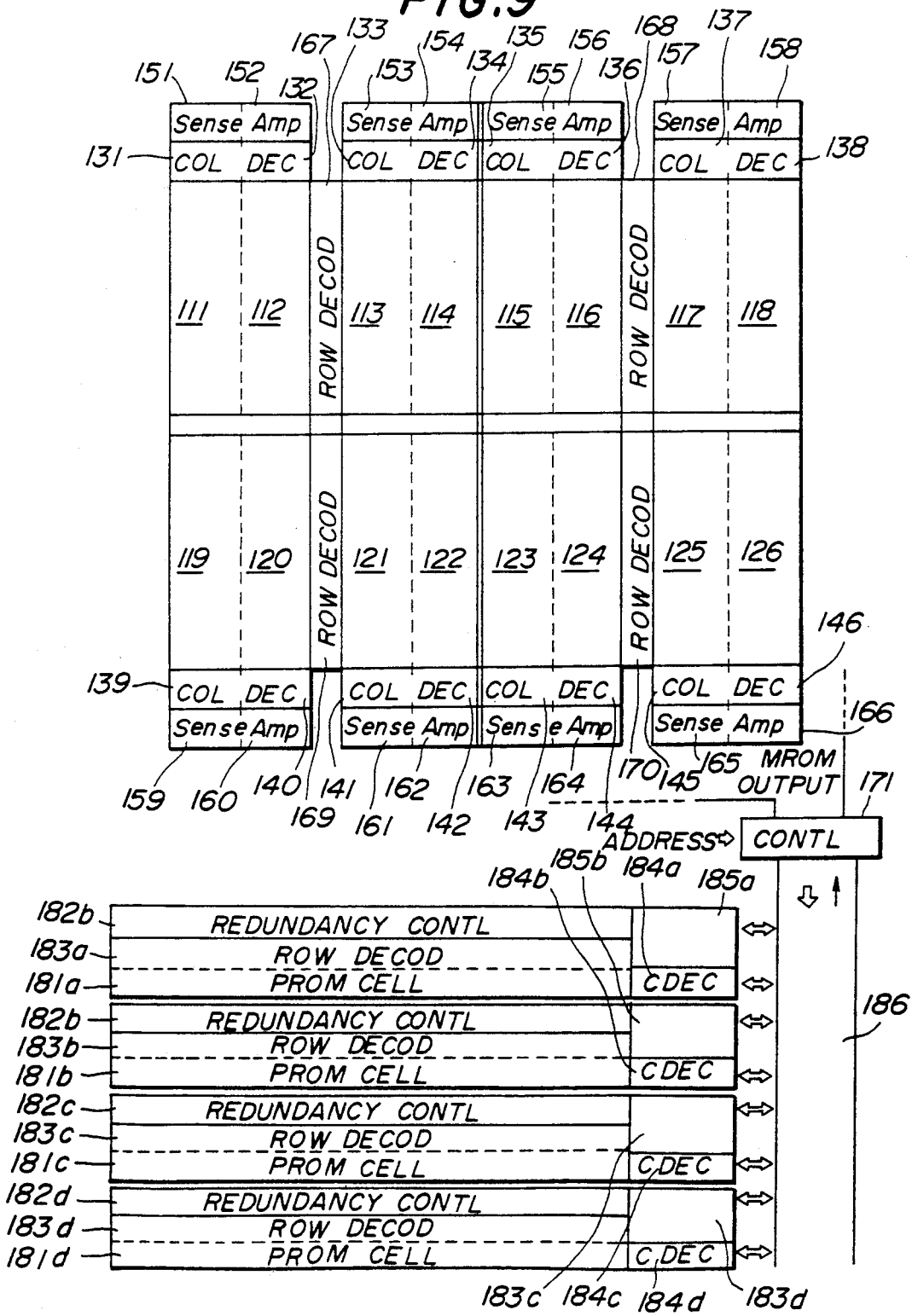
FIG. 9 is a system block diagram showing an essential part of a fifth embodiment of the semiconductor memory device according to the present invention.
Figure 10A:
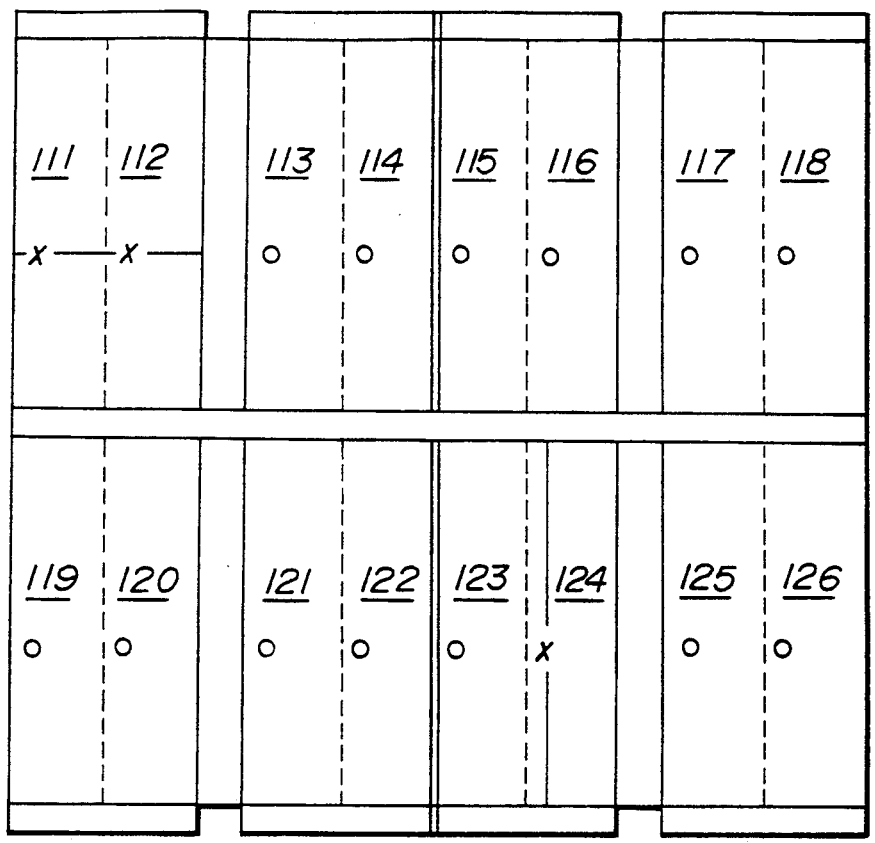
FIGS. 10A and 10B are diagrams for explaining the replacement of defective memory cells in the fifth embodiment.
Figure 10B:
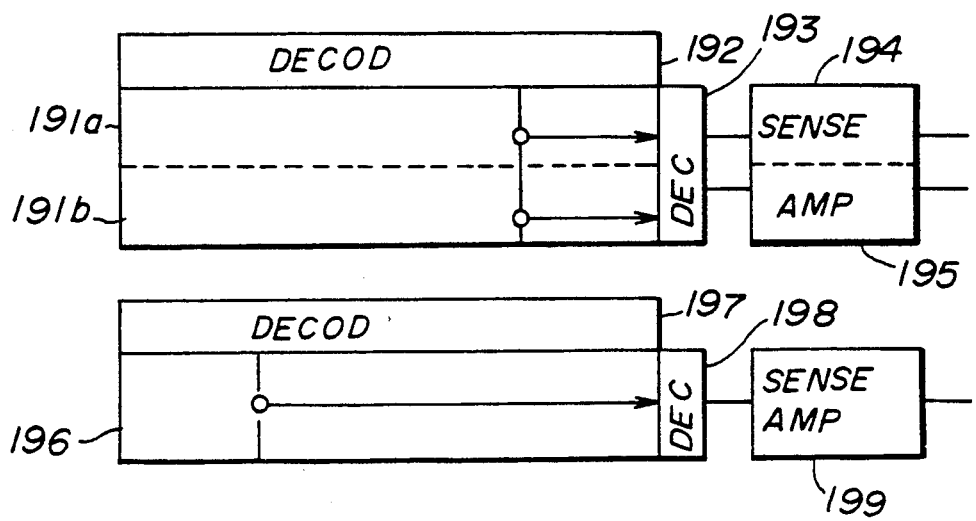

Next, a description will be given of a fifth embodiment of the semiconductor memory device according to the present invention, by referring to FIGS. 9, 10A and 10B. FIG. 9 shows an essential part of the fifth embodiment, and FIGS. 10A and 10B are diagrams for explaining the replacement of defective memory cells in the fifth embodiment.

In FIG. 9, the word lines and the bit lines are divided into groups so as to reduce the length of the interconnection and reduce the time constant In addition, the output data is output simultaneously from a plurality of output terminals. For the sake of convenience, a 16-bit output data is output in this embodiment. Memory cells are divided into 16 cell blocks 111 through 126, and column decoders 131 through 146 and sense amplifiers 151 through 166 are respectively provided with respect to the cell blocks 111 through 126. In addition, row decoders 167 through 170 are respectively provided with respect to four groups of cell blocks. In this case, a first group of cell blocks includes the cell blocks 111 through 114, a second group of cell blocks includes the cell blocks 115 through 118, a third group of cell blocks includes the cell blocks 119 through 122, and a fourth group of cell blocks includes the cell blocks 123 through 126. The above described elements constitute the mask ROM (denoted by MROM in FIG. 9). The data which corresponds to the input address is read out from each of the cell blocks 111 through 126 at the same timing, and the 16-bit data which is read out is supplied to a control circuit 171. In other words, the bits of the output data are uniformly allocated to the cell blocks 111 through 126.

In this embodiment, four redundant memory cells 181$a$ through 181$d$ are provided. In addition, redundancy control circuits 182$a$ through 182$d$, row decoders 83$a$ through 183$d$, column decoders 184$a$ through 184$d$ and sense amplifiers 185$a$ through 185$d$ are respectively provided with respect to the redundant memory cells 181$a$ through 181$d$. The PROM is used for the redundant memory cells 181$a$ through 181$d$. The redundancy control circuits 182$a$ through 182$d$ compare the input address and the defective address and carry out various control operations for decoding the data from the redundant memory cells 181$a$ through 181$d$ when the two compared addresses coincide. These various control operations are carried out via a redundancy control bus 186. When the two compared addresses coincide, a control circuit 171 outputs the data from the redundant memory cells 181$a$ through 181$d$ in place of the data from the mask ROM.

When replacing the defective memory cells within the memory cell blocks 111 through 126, the addresses of the redundant memory cells are mutually different if the defective memory cells are located on mutually different memory cell blocks. For example, when the defective memory cells exist along the word line direction of the memory cell blocks 111 and 112 and along the bit line direction of the memory cell block 124 as indicated by "X" in FIG. 10A, the addresses of the redundant memory cells are mutually different. For this reason, in order to replace the defective memory cells in the memory cell blocks 111 and 112, decoders 192 and 193 and sense amplifiers 194 and 195 are respectively provided with respect to redundant memory cells 191$a$ and 191$b$ as shown in FIG. 10B. In addition, in order to replace the defective memory cell in the memory cell block 124, decoders 197 and 198 and a sense amplifier 199 are provided with respect to a redundant memory cell 196. In other words, the decoders are provided for each redundant memory cell.

According to this embodiment, it is possible to realize a high-speed operation of the semiconductor memory device. However, because the decoder is provided for each redundant memory cell, the number of decoders increases as the number of redundant memory cells increases. As a result, the decoders occupy a relatively large chip area, and there is still room for improvement as for the integration density of the semiconductor memory device.

Figure 11:
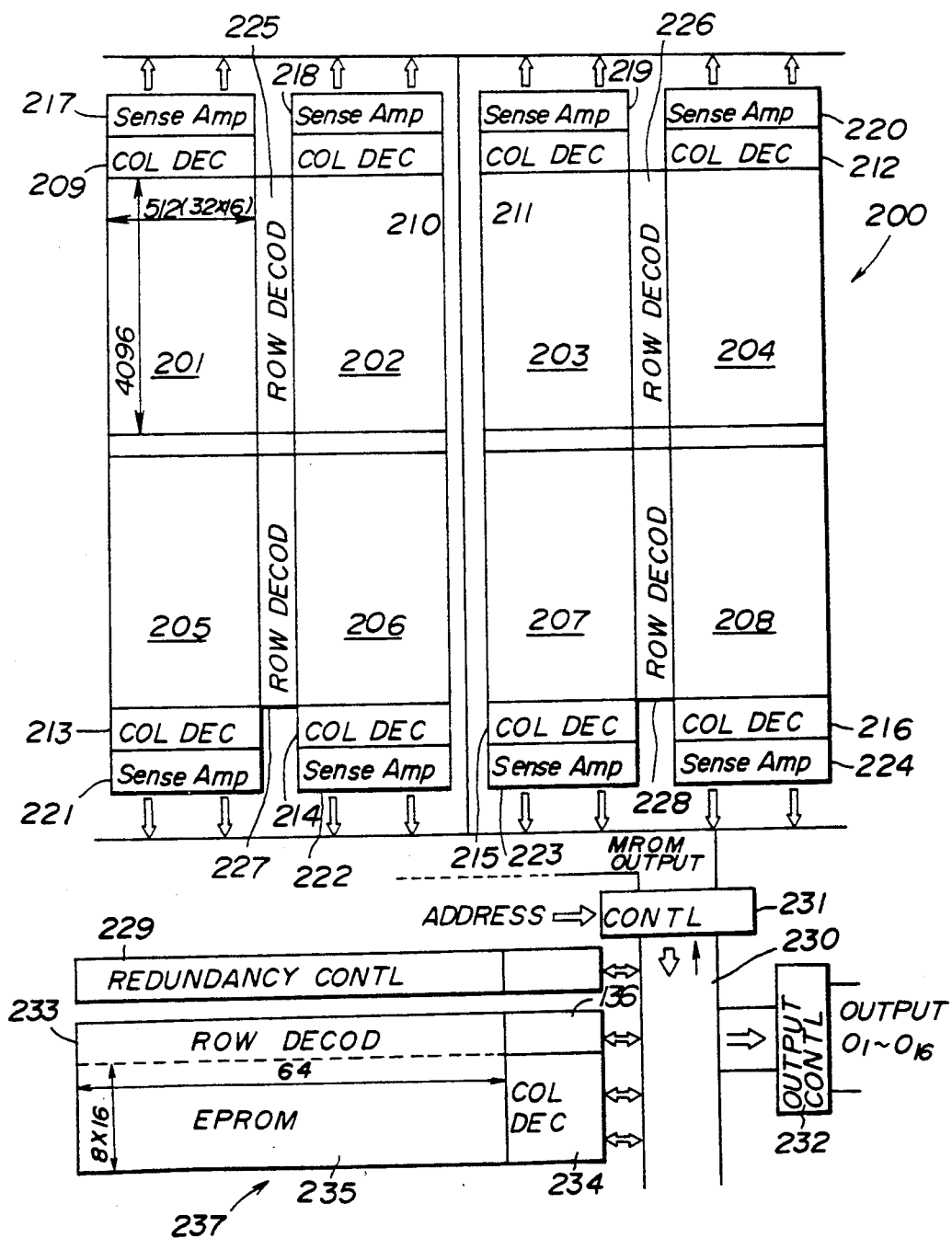
FIG. 11 is a system block diagram showing a sixth embodiment of the semiconductor memory device according to the present invention.

Next, a description will be given of a sixth embodiment of the semiconductor memory device according to the present invention, in which the chip area occupied by the decoders is minimized. FIG. 11 shows an essential part of the sixth embodiment. In FIG. 11, a first memory part 200 comprises the so-called mask ROM in which fixed 16-bit data are prestored. The mask ROM includes 8 memory cell blocks 201 through 208 which are selected depending on the input address signal, column decoders 209 through 216 which are respectively provided with respect to the memory cell blocks 201 through 208, sense amplifiers 217 through 224 which are respectively provided with respect to the memory cell blocks 201 through 208, and 4 row decoders 225 through 228. The structure of the mask ROM is basically the same as that of the known mask ROM, and in this embodiment, the memory cells are divided into the 8 memory cell blocks 201 through 208. The data can be read out from the memory cell of any of the memory cell blocks 201 through 208 depending on the input address signal.

The input address signal is supplied to a redundancy control circuit 229 which is made of an address comparison ROM, for example. When the input address coincides with the redundant address of the defective memory cell in any one of the memory cell blocks 201 through 208 of the first memory part 200, the redundancy control circuit 229 supplies a switch instruction signal to a control circuit 231 via a redundancy control bus 230.

Normally, the control circuit 231 selects one cell block depending on the input address signal, and the 16-bit data from the corresponding sense amplifier is output from an output control circuit 232 via the redundancy control bus 230 as output data bits $o_1$ through $o_{16}$. On the other hand, when when the switch instruction signal is output from the redundancy control circuit 229, the control circuit 231 selects and outputs a 16-bit data from a second memory part 237. The second memory part 237 comprises a row decoder 233, a column decoder 234, a programmable non-volatile redundant memory cells (so-called EPROM) 235, and a sense amplifier 236. The redundant cells 235 has a 16-bit structure, and only one row decoder 233 and one column decoder 234 are provided with respect to all of the redundant memory cells 235.

First, the 16-bit data in each of the memory cell blocks 201 through 208 of the first memory part 200 are checked along the word line direction. When a defective memory cell is found within the memory cell blocks 201 through 208, the redundant address which indicates the defective memory cell is set in the redundancy control circuit 229. In addition, the data identical to the data which are written in the memory cells of the row which includes the defective memory cell are written into one row of the redundant memory cells 235.

When the input address coincides with the redundant address of the defective memory cell (defective address), the redundancy control circuit 229 supplies the switch instruction signal to the control circuit 231 so that the data from the redundant memory cell 235 is selected and output as a 16-bit data from the output control circuit 232. In other words, the defective memory cell within the first memory part 200 is replaced by the redundant memory cell 235.

In this embodiment, the cell blocks 201 through 208 will not operate simultaneously. During one access to the first memory part 200, only one word line within one of the cell blocks 201 through 208 is activated to output the 16-bit data via the corresponding sense amplifier. The input address signal in effect is used to select one of the cell blocks 201 through 208. Accordingly, it is possible to realize a high-speed access by the division of the first memory part 200 into the cell blocks 201 through 208 and the activation of only one word line within the selected cell block.

Figure 12:
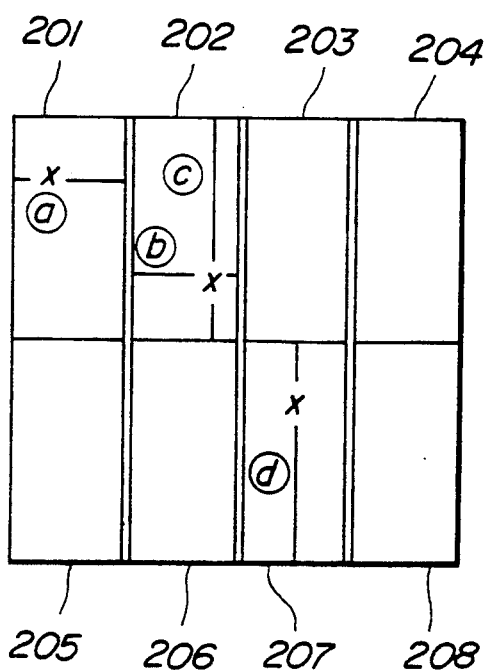
FIG. 12 is a diagram for explaining the state of defective memory cells in FIG. 11.

Next, a description will be given of the replacement of defective memory cells in this embodiment. FIG. 12 shows the state of the defective memory cells. In a case "a", there is a word line defect. In a case "b", there is a word line defect and there is also a bit line defect within the same cell block. In a case "c", there is a bit line defect and there is also a word line defect within the same cell block. In a case "d", there is a bit line defect.

Figure 13A:
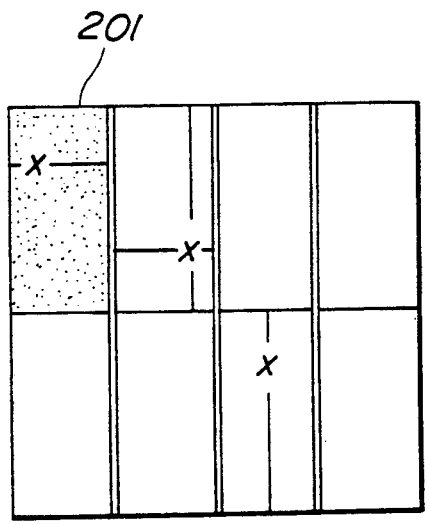
FIGS. 13A through 13D are diagrams for explaining the replacement of the defective memory cells in the sixth embodiment.
Figure 13B:
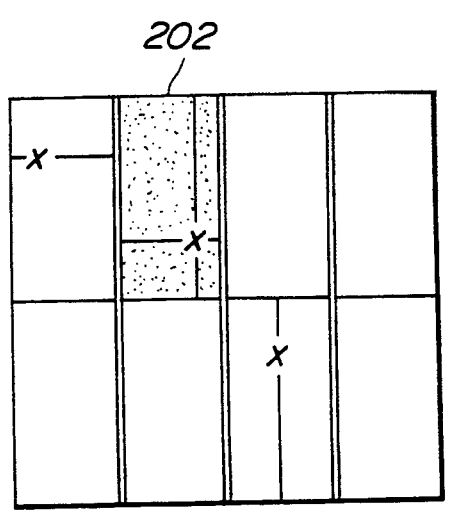
Figure 13C:
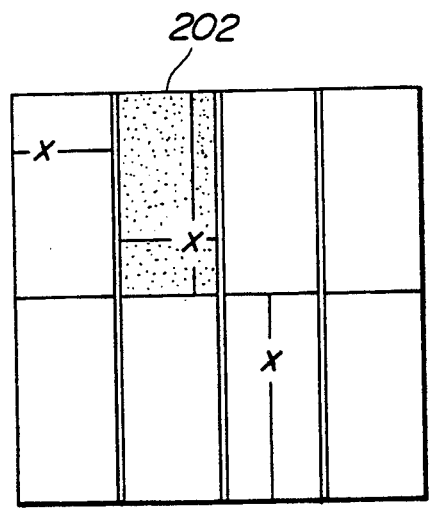
Figure 13D:
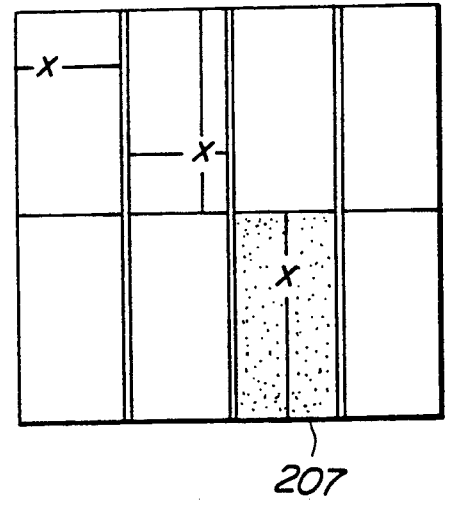

The defective memory cells in the cases "a" through "d" can be replaced by the redundant memory cells by setting the redundant address with respect to the concerned cell block as shown in FIGS. 13A through 13D. In other words, when the word line defect is detected for the cell block 201 as shown in FIG. 13A, the address of the word line is set as the redundant address. In addition, the original data which should have been stored in the memory cells connected to the word line are written into one row of the redundant memory cells 235 as 16 bits of data, and read out via the decoders 233 and 234. Hence, the word line defect is cured. Similarly, when the word line defect is detected for the cell block 202 in which the word line defect and the bit line defect coexist as shown in FIG. 13B, the defective word line is cured similarly as in the case "a" regardless of the bit line defect. In addition, when the bit line defect is detected within the cell block 202 as shown in FIG. 13C, the bit line defect is cured. When the bit line defect is detected within the cell block 207 as shown in FIG. 13D, the bit line defect is cured.

Hence, there is only one defect curing mode when making an access to a specific address. In other words, one word line defect or one bit line defect can be cured by writing the original 16-bit data into one row of redundant memory cells 235 and then read out via the decoders 233 and 234. As a result, the chip area occupied by the second memory part 237 is reduced, thereby making it possible to improve the integration density of the chip as a whole.

This embodiment is of course not limited to the case where the output data has 16 bits. The number of bits of the output data is arbitrary, as long as the plurality of bits of data are simultaneously output from the same cell block and the original data is written into one row of the redundant memory cells if one word line defect or bit line defect is detected.

For example, the first memory part 200 has a memory capacity of 16 Mbits, and each cell block has 4096 rows and 32 columns for outputting the 16-bit data. The redundant memory cells 235 amount to a memory capacity of 32 kbits, and there are 64 rows and 8 columns for writing and reading the 16-bit data.

This embodiment is advantageous in that the semiconductor memory device can operate at a high speed because the memory cells are divided into the cell blocks and the power consumption is small because only the selected cell block is activated Further, the chip area occupied by the redundant memory cells and the related decoders is small because only one pair of decoders are required with respect the redundant memory cells.

Next, a description will be given of a redundant circuit of a conventional SRAM and a redundant circuit of a conceivable mask ROM, for the purpose of facilitating the understanding of seventh and eighth embodiments of the semiconductor memory device according to the present invention.

Figure 14:
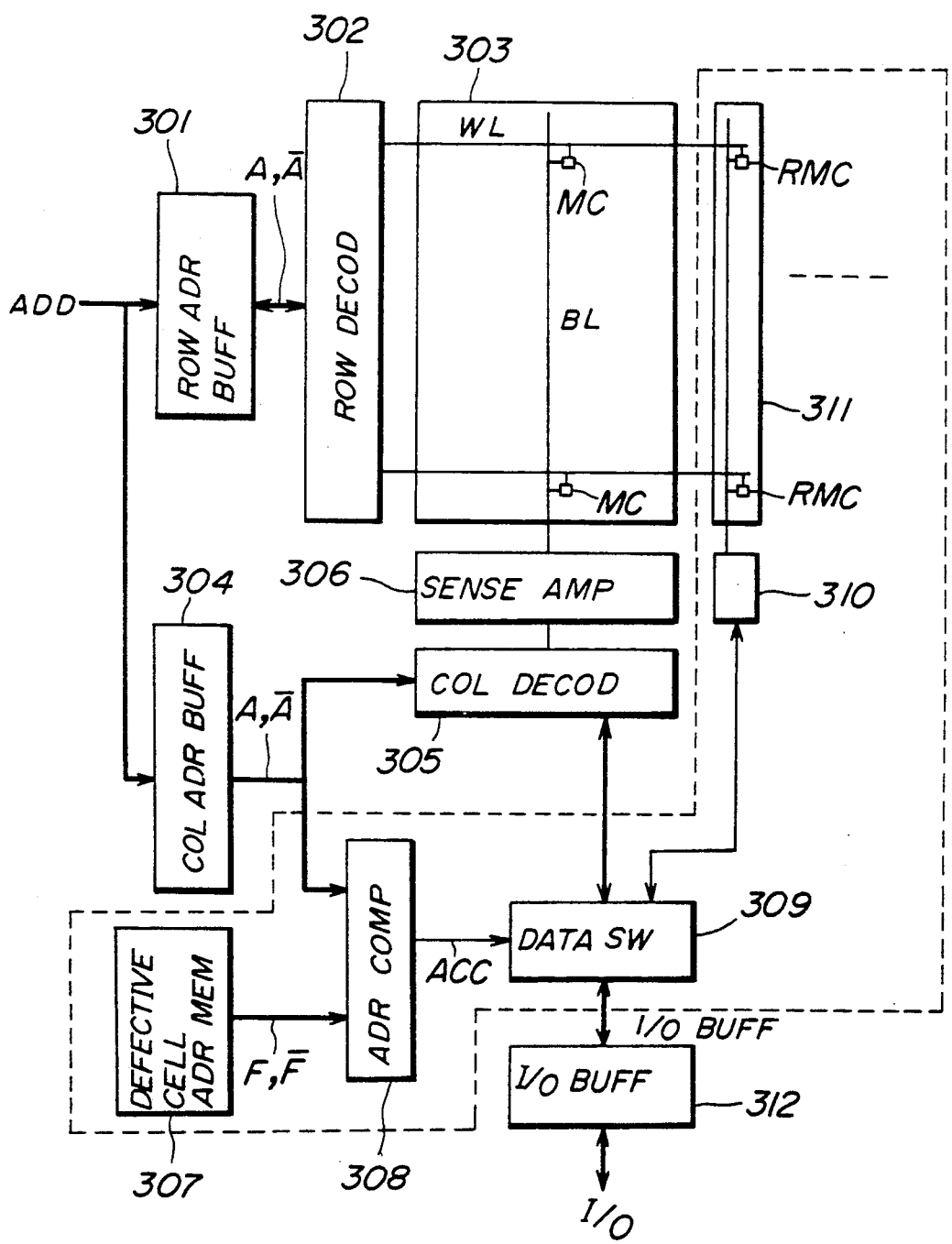
FIG. 14 is a system block diagram showing an essential part of a redundant circuit of a conventional SRAM.

FIG. 14 shows an essential part of a redundant circuit of a conventional SRAM. First, a description will be given of a normal access with respect to a normal memory cell array 303. An input address signal ADD is supplied to a row address buffer 301 and a column address buffer 304. In the row address buffer 301 and the column address buffer 304, the input address signal ADD is amplified from the TTL level to the MOS level so as to generate complementary address signals A and $\overline{A}$. The complementary address signals A and $\overline{A}$ are supplied to a row decoder 302 and a column decoder 305.

The row decoder 302 and the column decoder 305 decode the complementary address signals A and $\overline{A}$ and respectively select the designated word line WL and bit line BL. A memory cell MC which is connected to the designated word line WL and bit line BL is specified and the data is read out from the memory cell MC. The data is written into the memory cell MC by similarly designating the word line WL and the bit line BL. When writing the data, the data is supplied to the memory cell MC via an input/output buffer 312, a data switch circuit 309, the column decoder 305 and a sense amplifier 306.

When a defective memory cell due to bit line defect exists within the normal memory cell array 303, the address of the defective memory cell is found by the wafer probing test and prestored in a defective cell address memory 307. When the input address signal ADD corresponds to the defective cell, an address comparing circuit 308 compares defective address signals F and $\overline{F}$ from the defective cell address memory 307 and the address signals A and $\overline{A}$ and outputs a coincidence signal ACC. This coincidence signal ACC is supplied to the data switch circuit 309. When the coincidence signal ACC is output, this means that the memory cell MC to which the access is made by the input address signal ADD is a defective memory cell. Hence, the data switch circuit 309 selectively outputs the data which is obtained from a redundant memory cell RMC of a redundant memory cell array 311 via a redundant sense amplifier 310, and not the data which is obtained from the column decoder 305.

The data from the defective memory cell is thus replaced by the data from the redundant memory cell RMC. For this reason, even when a defective memory cell exists within the normal memory cell array 303, the chip can operate as if it contains no defective memory cell. The data flow during the write operation is similar to that during the read operation.

In FIG. 14, the redundant circuit is surrounded by a phantom line. In the redundant circuit, the same method is employed to store the defective cell address in the defective cell address memory 307 and to program the replacement data in the redundant memory cell array 311.

Figure 15:
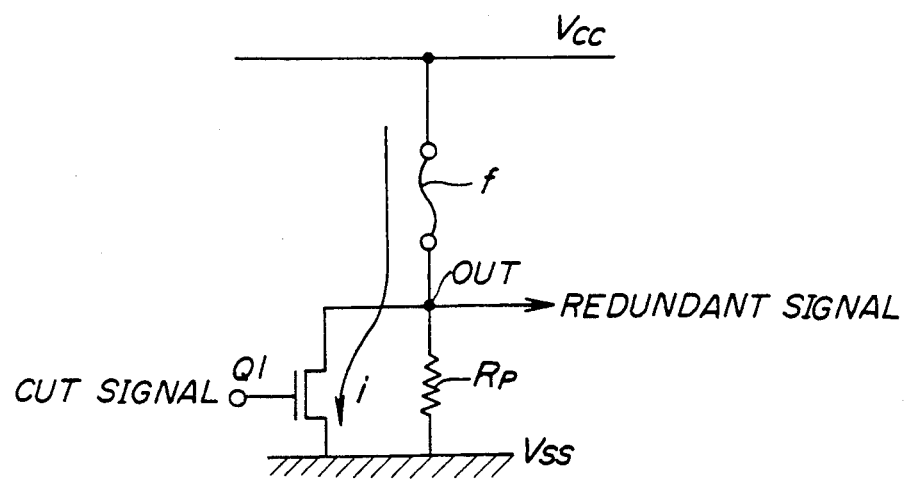
FIG. 15 is a circuit diagram showing an equivalent circuit of a memory cell of a conventional defective cell address memory.

FIG. 15 shows an equivalent circuit of the memory cell of the defective cell address memory 307. A polysilicon fuse f is melted and cut by applying a large current i. In this case, a logic value "0" is stored r when the fuse f is cut and a logic value "1" is stored when the fuse f is not cut. When cutting the fuse f, a high-level cut signal is applied to a gate of a driving N-channel MOS transistor Q1 to turn the transistor Q1 ON. Hence, the large current i flows from a power source Vcc to the ground GND via the polysilicon fuse f and the transistor Q1, and the polysilicon fuse f is cut by the large current i. Thereafter, the potential at a node OUT is pulled down to Vss through a pull-down resistor Rp by cutting OFF the transistor Q1, and a redundant signal having the logic value "0" is output from the node OUT. On the other hand, when not cutting the polysilicon fuse f, the transistor Q1 is turned OFF. In this case, the node OUT is maintained in a high impedance state by the pull-down resistor Rp, and a redundant signal (Vcc) having the logic value "1" is output from the node OUT.

Figure 16:
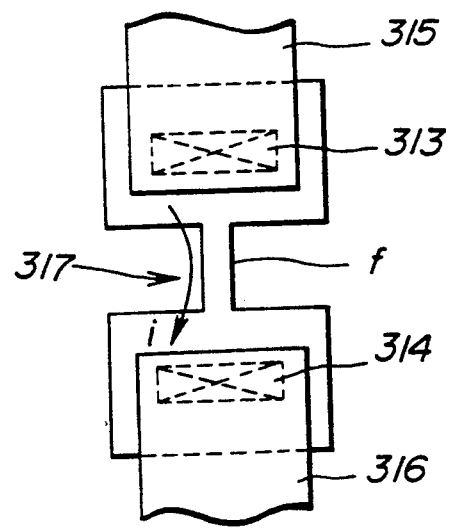
FIG. 16 is a diagram showing a structure of the defective cell address memory.

FIG. 16 is a plan view showing the fuse pattern. In FIG. 16, the polysilicon fuse f is formed at a lowermost layer, and Al interconnections 315 and 316 are respectively connected to the ends of the polysilicon fuse f via contact holes 313 and 314. A narrow portion 317 of the polysilicon fuse f is melted and cut by the large current i.

Figure 17:
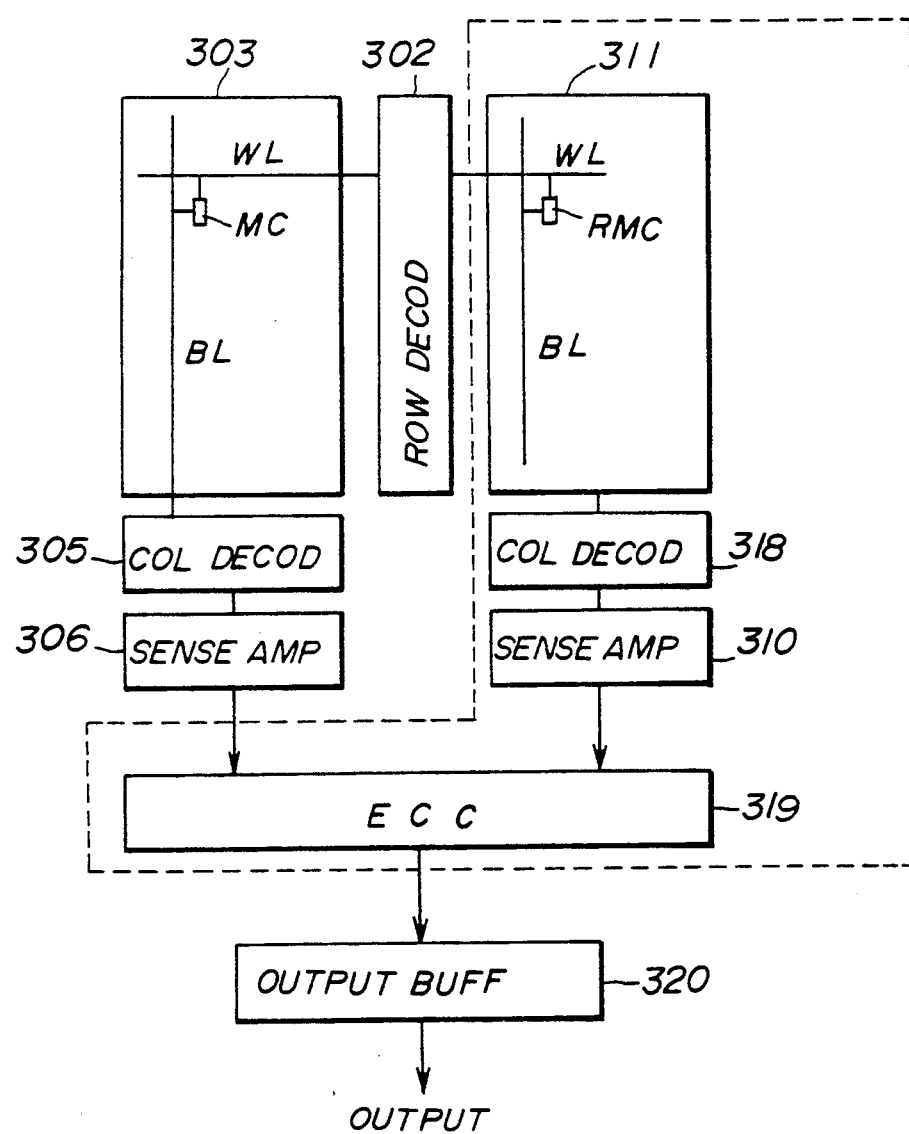
FIG. 17 is a system block diagram showing an essential part of a redundant circuit of a conceivable mask ROM.

Next, a description will be given of a conceivable mask ROM, by referring to FIG. 17. In FIG. 17, those parts which are essentially the same as those corresponding parts in FIG. 14 are designated by the same reference numerals, and a description thereof will be omitted.

In FIG. 17, a redundant circuit has an error correcting code (ECC) circuit 319 for generating a correct data from the data which is read from the normal memory cell array 303 via the sense amplifier 306 and the data which is read from the redundant memory cell RMC via the redundant sense amplifier 310. The correct data which is obtained from the ECC circuit 319 is output via an output buffer 320. The data is written into the redundant memory cell RMC during the production process of the mask ROM, and this data is generated from the data which is prestored in the normal memory cell array 303 by use of the Hamming code.

But when the redundant circuit is provided with respect to the mask ROM by applying the technique for the SRAM shown in FIG. 14, the chip area occupied by the redundant circuit becomes large and the advantageous features of the mask ROM such as the high integration density is lost.

First, the data are written into the mask ROM during the production process, and the writing of the data is carried out quite differently from the DRAM and SRAM. For this reason, in order to store the defective cell address, it is necessary to add the defective cell address memory 307 and the redundant memory cell array 311 by a process independent of the process which forms the mask ROM.

Second, even if the redundant memory cell array 311 were formed by use of the polysilicon fuse f shown in FIGS. 15 and 16, the chip area occupied by the redundant memory cell array 311 becomes extremely large compared to the normal memory cell array 303 and the semiconductor memory device as a whole becomes large. According to the programming method using the polysilicon fuse f shown in FIG. 15, it is necessary to provide the driving transistor Q1 which occupies a large area in order to cut one fuse f with the large current i, and the provision of the driving transistor Q1 increases the chip area of the redundant memory cell RMC per bit. Because several kbits of the redundant memory cells RMC are required, the redundant memory cell array 311 as a whole occupies a large chip area.

On the other hand, according to the method shown in FIG. 17 using the ECC circuit 319, the programming to the redundant memory cell RMC of the redundant memory cell array 311 is made during the production process, and both the normal memory cell array 303 and the redundant memory cell array 311 can be constituted by the mask ROM. However, the redundant memory cell array 311 requires a large number of bits and the redundant memory cell array 311 occupies a large chip area. For example, it is necessary to provide 5 redundant bits with respect to 16 bits, and in this case, the redundant memory cell array 311 occupies 5/16 times the chip area occupied by the normal memory cell array 303. As a result, it is unavoidable that the semiconductor memory device as a whole becomes large.

Figure 18:
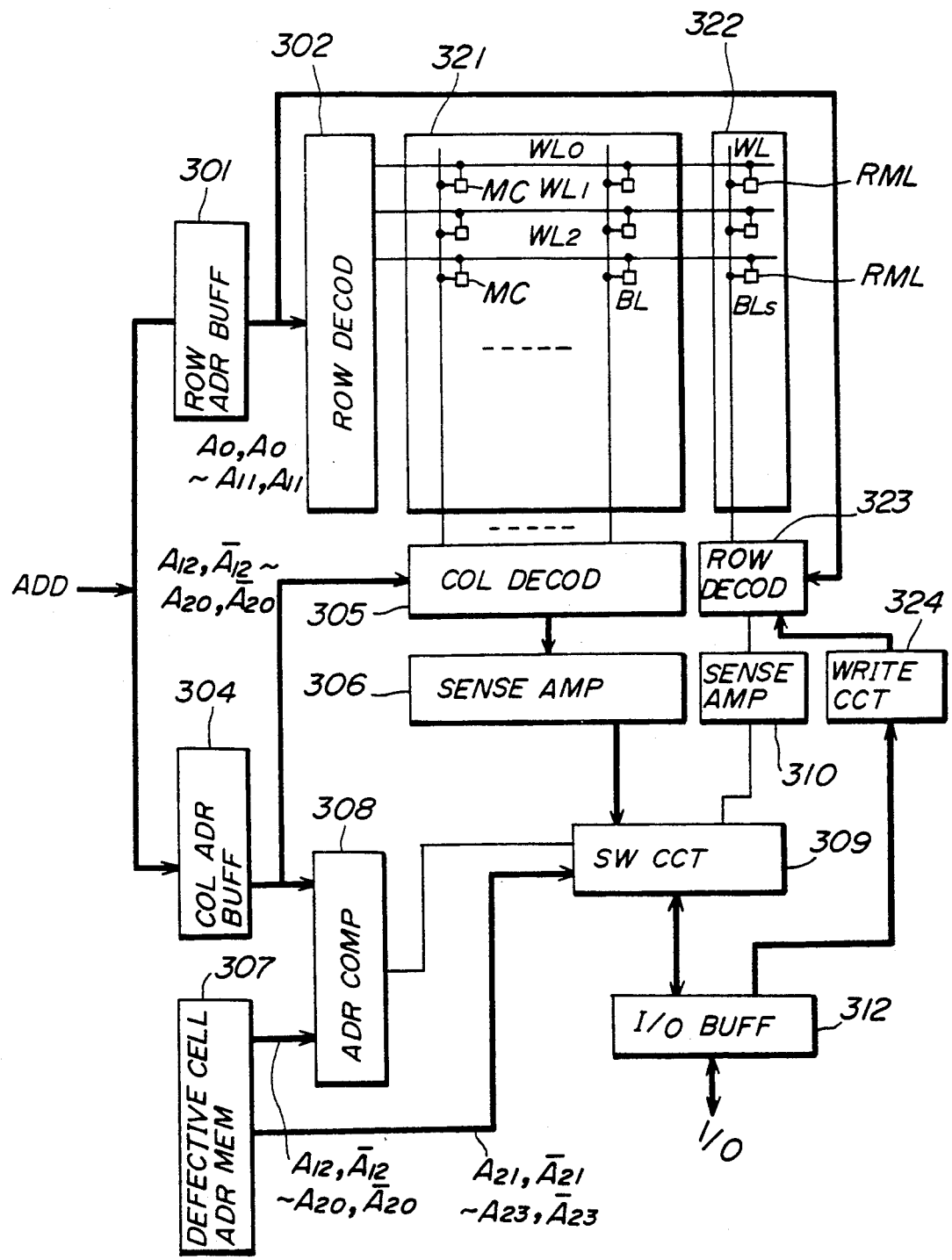
FIG. 18 is a system block diagram showing an essential part of a seventh embodiment of the semiconductor memory device according to the present invention.

Next, a description will be given of the seventh embodiment of the semiconductor memory device according to the present invention, by referring to FIG. 18. In FIG. 18, those parts which are essentially the same as those corresponding parts in FIG. 14 are designated by the same reference numerals, and a description thereof will be omitted.

This embodiment shown in FIG. 18 is characterized in that a normal memory cell array 321 is constituted by a mask ROM and a redundant memory cell array 322 is constituted by a floating gate type EPROM. Further, a row decoder 323 is provided to select a spare bit line BLs of the redundant memory cell array 322, and a write circuit 324 is provided to write the data into the redundant memory cell array 322.

Figure 19A:
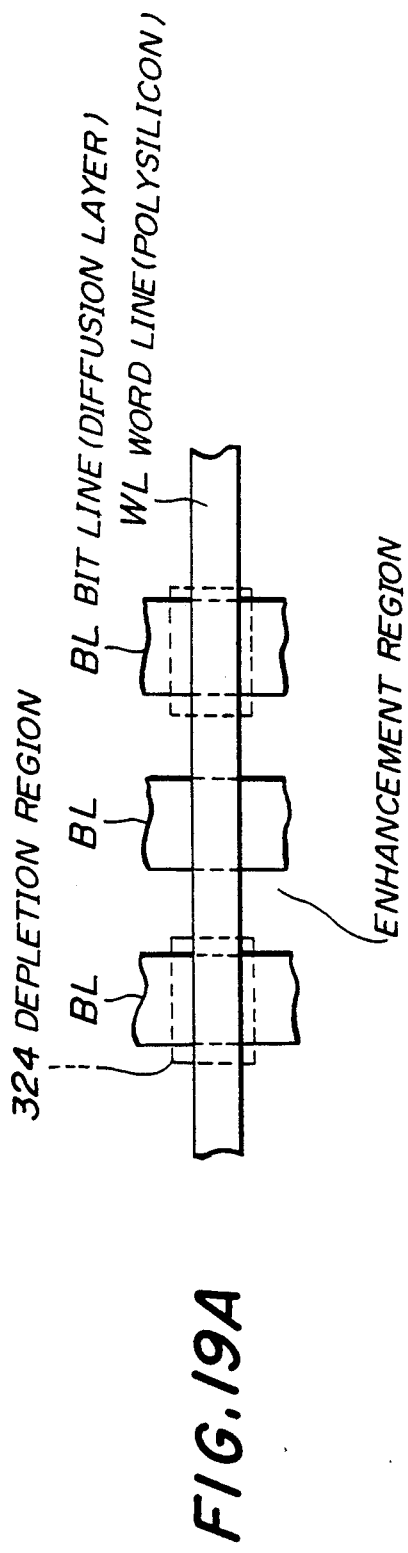
FIGS. 19A and 19B are a plan view and a cross sectional view respectively showing an essential part of a normal memory cell array of the seventh embodiment.
Figure 19B:
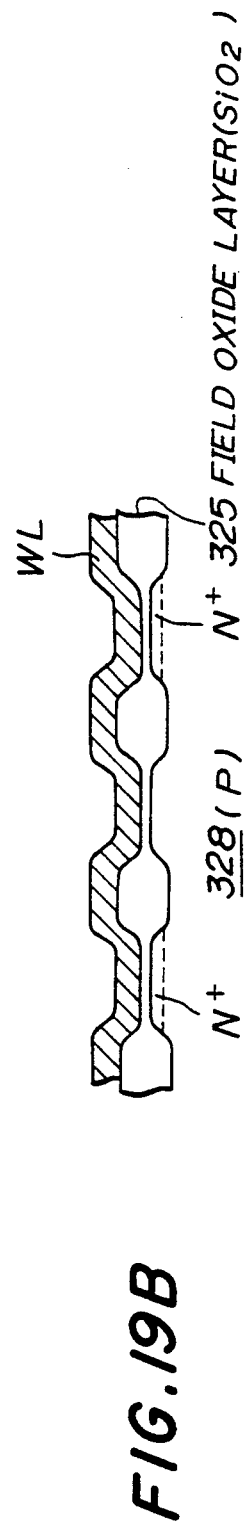

FIGS. 19A and 19B are a plan view and a cross sectional view respectively showing an essential part of the normal memory cell array 321 of the seventh embodiment. As shown in FIGS. 19A and 19B, the mask ROM is normally comprises a polysilicon layer. Accordingly, in order to form the redundant memory cell array 322 without greatly modifying the process of producing the normal memory cell array 321, the redundant memory cell array 322 must be designed to have a polysilicon layer similarly to the normal memory cell array 321. In addition, the redundant memory cell array 322 must be programmable so that the redundant memory cells RMC corresponding to the defective memory cells can be programmed after the redundant memory cell array 322 is produced.

Figure 20A:
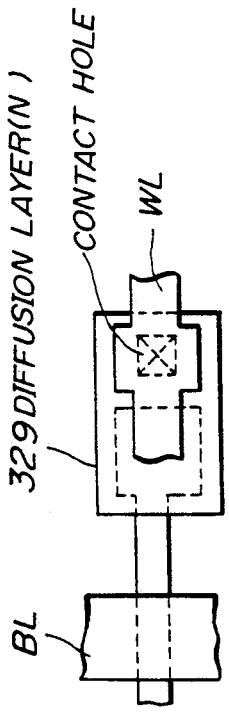
FIGS. 20A and 20B are a plan view and a cross sectional view respectively showing an essential part of a redundant memory cell array of the seventh embodiment.
Figure 20B:
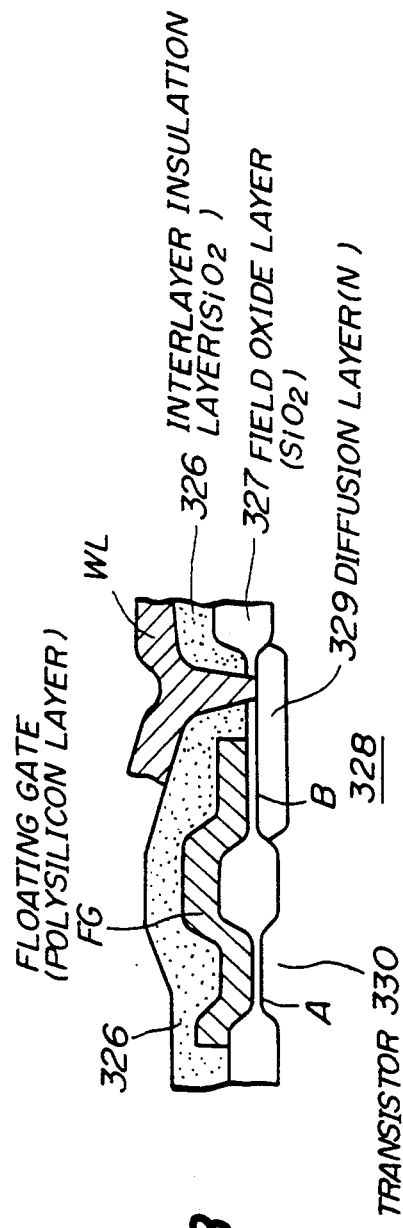

In this embodiment, the redundant memory cell array 322 is constituted by the EPROM which comprises the polysilicon layer. FIGS. 20A and 20B are a plan view and a cross sectional view respectively showing an essential part of the redundant memory cell array 322, and FIG. 20C is a cross sectional view showing a correspondence of the redundant memory cell array 322 and the EPROM.

As shown in FIGS. 20A and 20B, a $SiO_2$ field oxide layer 327 is formed on a P-type substrate 328, and a floating gate FG made of a single polysilicon layer is formed on the field oxide layer 327. A $SiO_2$ interlayer insulator layer 326 is formed on the floating gate FG, and the word line WL is formed on the interlayer insulator layer 326 so as to connect to an N-type diffusion layer 329. This N-type diffusion layer 329 forms the spare bit line BLs. A transistor region 330 forms the redundant memory cell RMC.

Figure 20C:
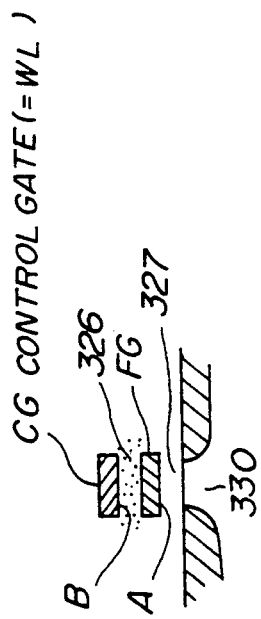
FIG. 20C is a cross sectional view showing a correspondence of the redundant memory cell array and the EPROM.

The redundant memory cell RMC is electrically equivalent to the EPROM shown in FIG. 20C. In other words, because the word line WL is arranged to confront the floating gate FG via the interlayer insulator layer 326, the word line WL is equivalent to a control gate CG. The floating gate FG is formed on the transistor region 330 via the field oxide layer 327. In FIGS. 20B and 20C, A denotes an interface between the floating gate FG and the field oxide layer 329 which are located above the transistor region 330, and B denotes an interface between the floating gate FG and the field oxide layer 327 which are located above the diffusion layer 329.

The redundant memory cell RMC which has the above described structure stores the data with respect to the defective memory cell in place of the normal memory cell of the normal memory cell array 321. The data is stored in the redundant memory cell RMC by applying a voltage across the word line WL and the spare bit line BLs, so that a charge is accumulated within the floating gate FG.

According to this embodiment, the redundant memory cell RMC can be formed from polysilicon and the redundant memory cell RMC is programmable.

The structure of the redundant memory cell RMC itself was described heretofore. Next, a description will be given of a matrix structure of the redundant memory cell array 322. For example, in the case of a 16 Mbit mask ROM, the normal memory cell array 321 is constituted by 4 k (rows)×4 k (columns). In this case, the redundant memory cell array 322 must have 4 k (rows)×1 (column) in order to replace the defective memory cell of one bit line BL. However, the redundant memory cell RMC of the redundant memory cell array 322 usually occupies a large area compared to the memory cell MC of the normal memory cell array 221. For this reason, it is difficult in actual practice to form the redundant memory cell array 322 with 4 k (rows)×1 (column). Hence, in this embodiment, the redundant memory cell array 322 is formed as a cell array with 512 (rows)×8 (columns), and the row decoder 323 decodes the data of 8 columns into the data of one column using row address signals $\overline{A0}$ through $\overline{A11}$ and A0 through A11 which are obtained from the row address buffer 301. As a result, it is possible to suppress the increase of the area occupied by the redundant memory cell array 322.

Normally, the mask ROM makes a 8-bit output. Accordingly, the defective cell address memory 307 must not only store the redundant address but also an information which indicates a defective bit of the 8-bit output. This information A21 through A23 and $\overline{A21}$ through $\overline{A23}$ from the defective cell address memory 307 and the coincidence signal from the address comparing circuit 308 are used to switch the switch circuit 309 so that the defective bit from the normal memory cell array 321 is replaced by the output data of the redundant memory cell array 322.

Figure 21:
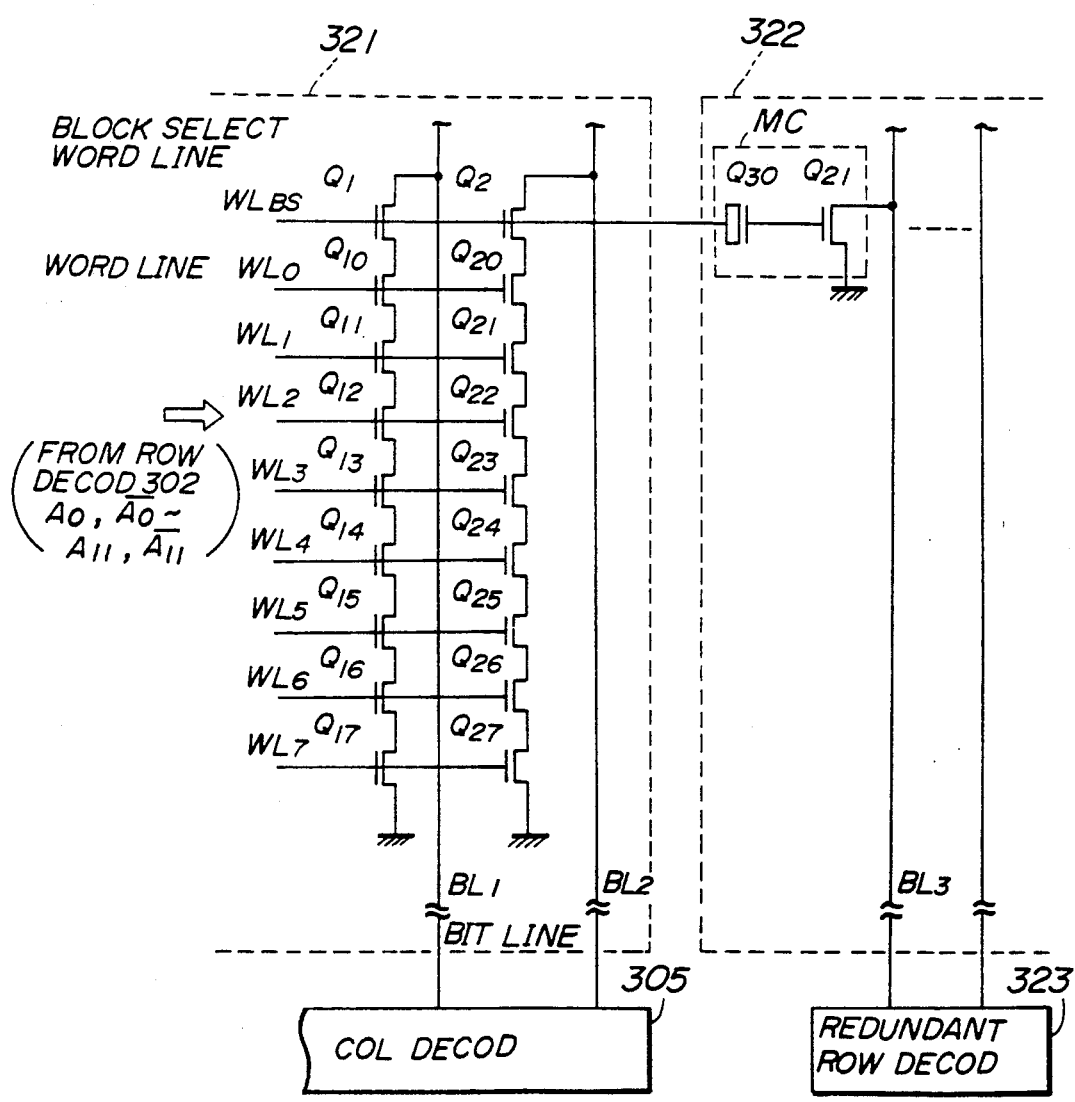
FIG. 21 is a system block diagram showing a connection of the normal memory cell array and the redundant memory cell array of the seventh embodiment.

FIG. 21 shows a connection of the normal memory cell array 321 and the redundant memory cell array 322. Presently, the generally used cell structure employed in the mask ROM is the so-called NAND type. As shown in FIG. 21, the normal memory cell array 321 comprises blocks, and each block has 8 (or 16) cell transistors Q10 through Q17 which are connected in series. One block is regarded as a block selecting cell transistor Q1B which is driven by a block select word line $WL_{BS}$. In addition, the block select word line $WL_{BS}$ is regarded as the word line WL of the redundant memory cell array 322. The address signal which corresponds to selecting of the 8 series-connected cell transistors Q10 through Q17 selects a bit line BL3 of the redundant memory cell array 322.

In this case, the redundant memory cell RMC comprises a metal insulator semiconductor (MIS) transistor Q21 which has a source (or drain) connected to the bit line BL3, and a MIS capacitor Q30. One electrode of the MIS capacitor Q30 is connected to a gate of the MIS transistor Q21, and the other electrode of the MIS capacitor Q30 is connected to the block select word line $WL_{BS}$.

Figure 22:
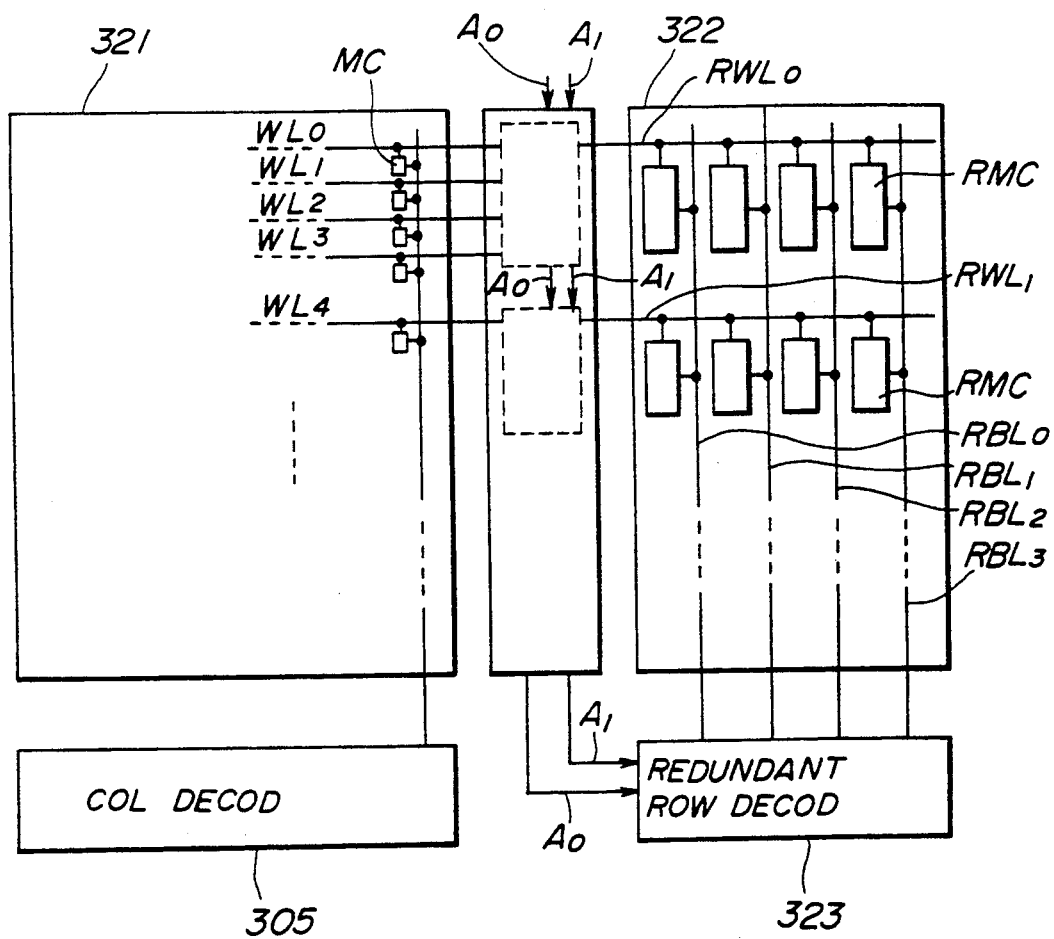
FIG. 22 is a system block diagram showing an arrangement of the redundant memory cell array for explaining the curing of the bit line defect in the seventh embodiment.

Because the redundant memory cell RMC occupies an area greater than that occupied by the normal memory cell MC, it is impossible to arrange the redundant memory cells RMC with the same arrangement as the normal memory cells MC. Hence, as shown in FIG. 22, the redundant memory cells RMC are arranged with a pitch which is four times that of the normal memory cells MC. The number of redundant memory cells RMC which can be arranged is thus ¼ that of the normal memory cells MC, and four columns of the redundant memory cells RMC are provided. FIG. 22 shows a case where the bit line defect is to be cured by replacing the defective memory cell by the redundant memory cell RMC. When selecting redundant bit lines RBL0 through RBL3, a signal A0 for selecting one word line out of the word lines WL0 through WL3 and a signal A1 for selecting one word line out of the word lines WL4 through WL7 are supplied to the redundant row decoder 323, so as to select one bit line out of the four redundant bit lines RBL0 through RBL3.

Figure 23:
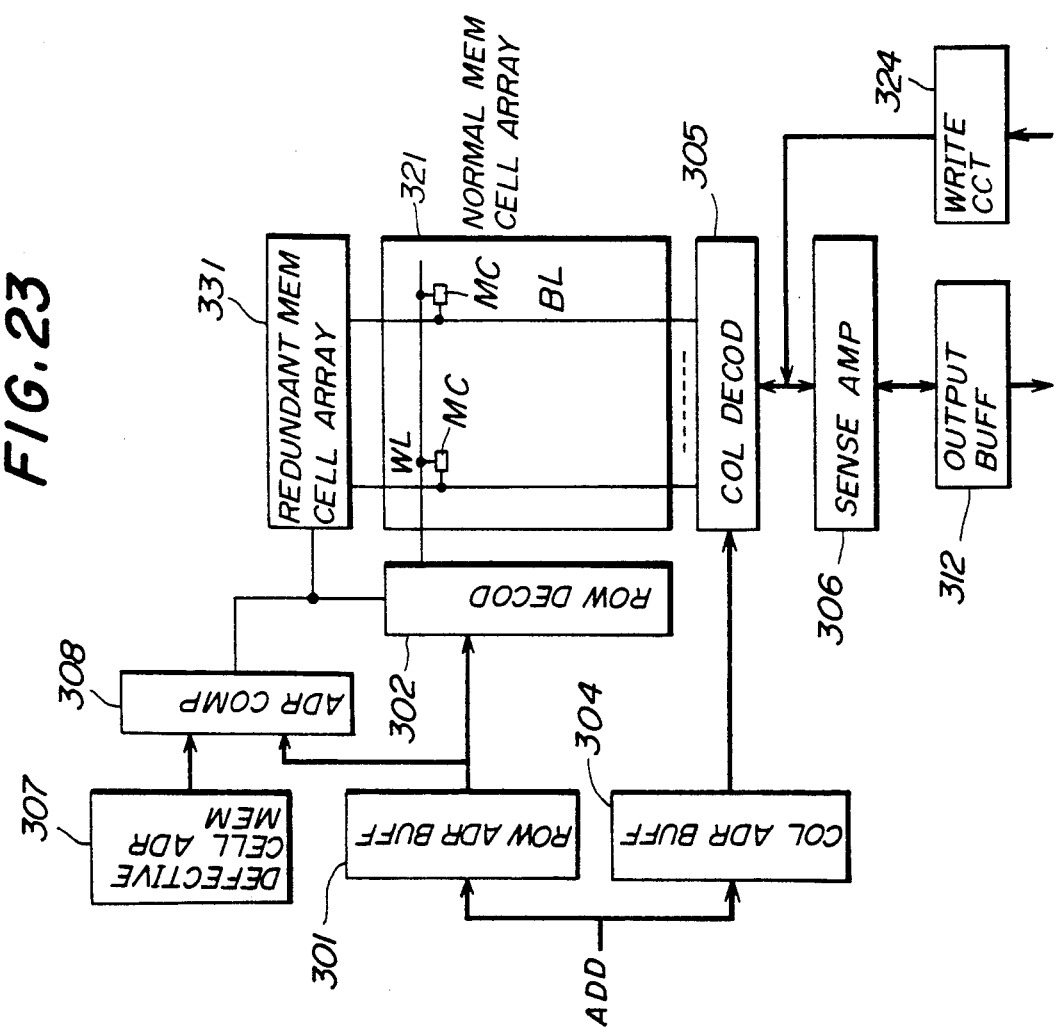
FIG. 23 is a system block diagram showing an essential part of an eighth embodiment of the semiconductor memory device according to the present invention.

Next, a description will be given of the eighth embodiment of the semiconductor memory device according to the present invention, by referring to FIG. 23. In FIG. 23, those parts which are essentially the same as those corresponding parts in FIG. 18 are designated by the same reference numerals, and a description thereof will be omitted.

This embodiment shown in FIG. 23 differs from the seventh embodiment shown in FIG. 18 in that a redundant memory cell array 331 is provided on the row side of the normal memory cell array 321. Hence, the defective cell address memory 307 and the address comparing circuit 308 operates based on the address signal from the row address buffer 301, and the arrangement of the redundant memory cells RMC in the redundant memory cell array 331 is different from that of the seventh embodiment.

When replacing the defective memory cell of the defective word line WL by the redundant memory cell RMC, the redundant memory cell array 331 with 1 (row)×4 k (columns) is arranged parallel to the word line WL. Furthermore, the address comparing circuit 308 detects that the defective word line WL is selected based on the defective cell address data which is obtained from the defective cell address memory 307 and the row address data which is obtained from the row address buffer 301, and the defective word line WL is replaced by the word line WL of the redundant memory cell array 331.

Figure 24:
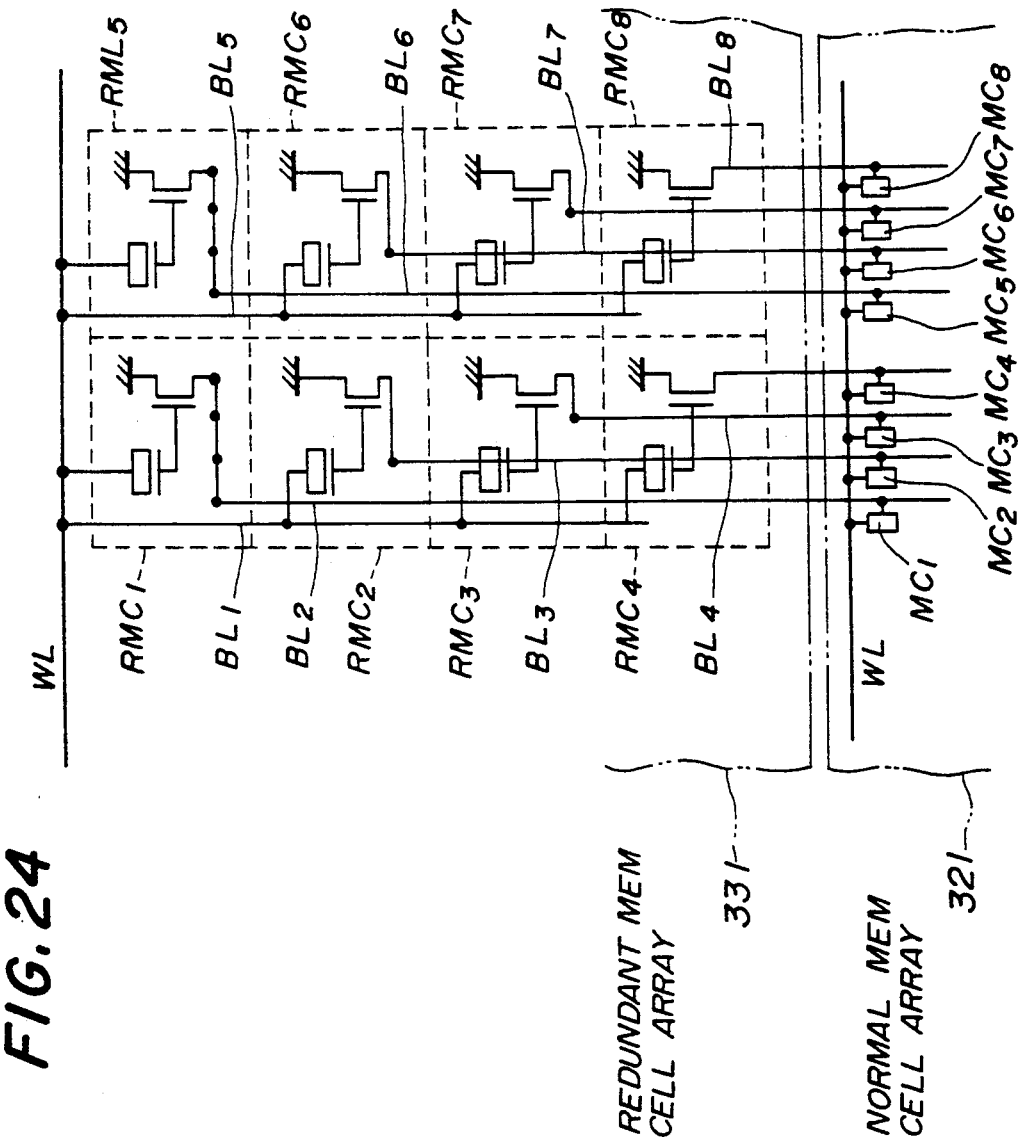
FIG. 24 is a circuit diagram for explaining an arrangement of a redundant memory cell array of the eighth embodiment.

In the redundant memory cell array 331, the redundant memory cell RMC of the redundant memory cell array 331 also occupies an area greater than that of the normal memory cell MC of the normal memory cell array 321. Hence, four redundant memory cells RMCl through RMC4 are arranged vertically as shown in FIG. 24. By taking this measure, the pitch of the redundant memory cells RMC along the column direction becomes four times that of the normal memory cells MC, but the redundant memory cells RMC fit within the total width of four normal memory cells MCl through MC4 and a large number of redundant memory cells RMC can be arranged as shown in FIG. 24.

Figure 25:
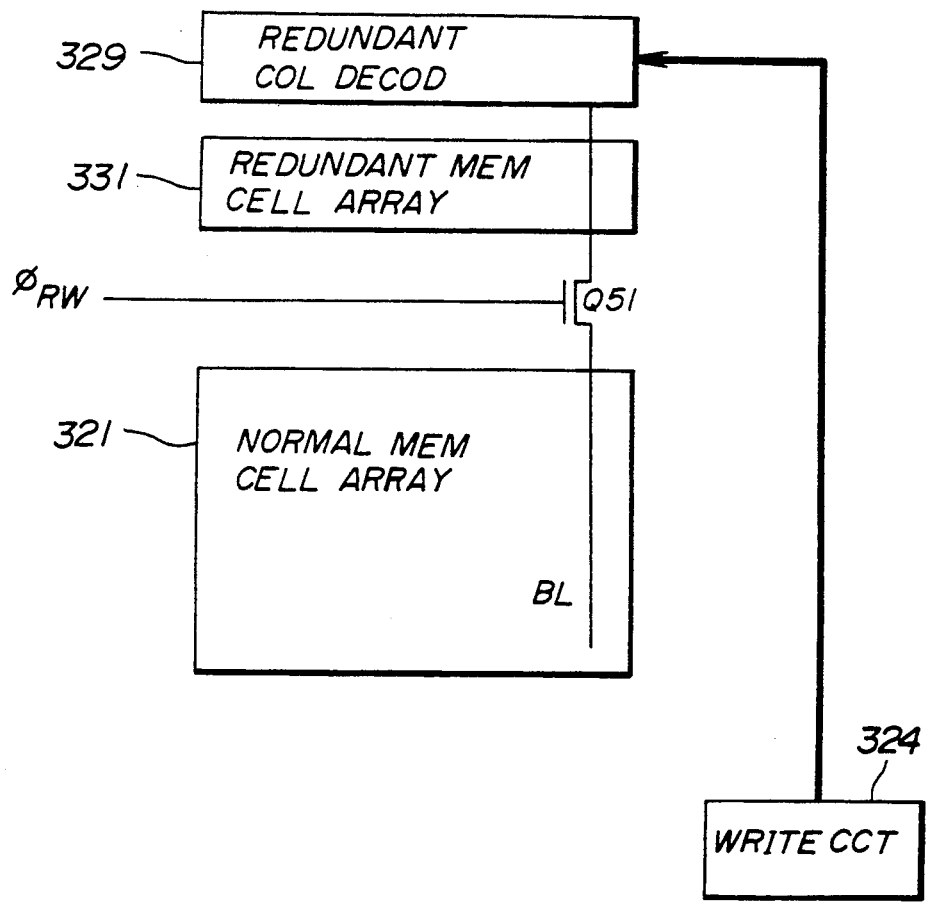
FIG. 25 is a system block diagram showing a connection of a normal memory cell array and the redundant memory cell array of the eighth embodiment.

On the other hand, when the normal memory cell array 321 (mask ROM) and the redundant memory cell array 331 (EPROM) coexist on the chip, a problem occurs from the point of view of the bit line voltage. That is, the operating voltage of the normal memory cell MC is usually in the order of 2 V, while the write voltage of the redundant memory cell RMC is usually in the order of 12 V. Accordingly, there is a danger of breaking the normal memory cell if the bit line BL is directly connected to the normal memory cell MC and the redundant memory cell RMC. For this reason, an isolation transistor Q51 shown in FIG. 25 is provided between the redundant memory cell array 331 and the normal memory cell array 321 for each of the bit lines BL, and this transistor Q51 is switched by a write control signal $\phi_{RW}$. Thus, the normal memory cell array 321 and the redundant memory cell array 331 are isolated during the write operation.

Of course, the principle of the seventh and eighth embodiments is not limited to the application to the redundant memory. For example, the principle can be applied similarly to the defective cell address memory 307. In this case, it is possible to use a common process when producing the semiconductor memory device.

In the first embodiment shown in FIG. 2, for example, it is necessary to designate whether the defective memory cell of the word line or the bit line is to be replaced by the redundant memory cell. This means that only the defective memory cell of the designated line can be replaced by the redundant memory cell, and there is still room for improving the efficiency with which the defective memory cells are replaced by the redundant memory cells.

On the other hand, in order to improve the efficiency with which the defective memory cells are replaced by the redundant memory cells, it is possible to consider increasing the capacity of the spare memory cells and making the redundant structure more complex. However, it is undesirable to do so since the such a structure would occupy a large chip area and require a complex control. In addition, the semiconductor memory device would become expensive.

Figure 26:
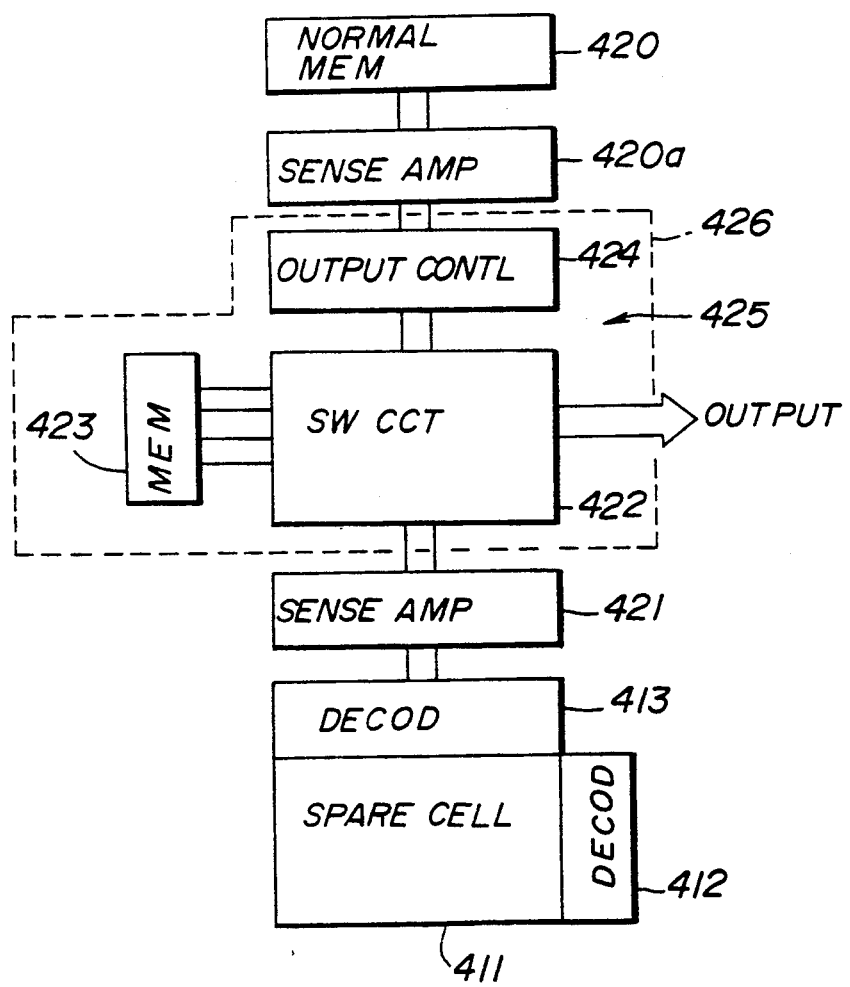
FIG. 26 is a system block diagram showing an essential part of a ninth embodiment of the semiconductor memory device according to the present invention.

Next, a description will be given of a ninth embodiment of the semiconductor memory device in which the efficiency with which the defective memory cells are replaced by the redundant memory cells is improved. FIG. 26 shows an essential part of the ninth embodiment. It is assumed for the sake of convenience that the mask ROM outputs a 16-bit output.

In FIG. 26, a normal memory part 420 includes a normal memory cell array and row and column decoders as in the case of the first embodiment. The normal memory part 420 and a sense amplifier 420a hence corresponds to an essential part of the mask ROM.

Row and column decoders 412 and 413 are connected to a spare (redundant) memory cell array 411. An output from the spare memory cell array 411 is supplied to a switch circuit 422 via a sense amplifier 421. A memory 423 stores one or a plurality of bits out of the multi-bit output of the normal memory cell array 420 which are to be replaced by the 16-bit data in the spare memory cell array 411. A select instruction for the replacement is generated based on the bit or bits stored in the memory 423. An output control circuit 424 controls the data which is output from the normal memory cell array 420 via the sense amplifier 421a. This output control circuit 424 corresponds to the select circuit 25 of the first embodiment.

Figure 27:
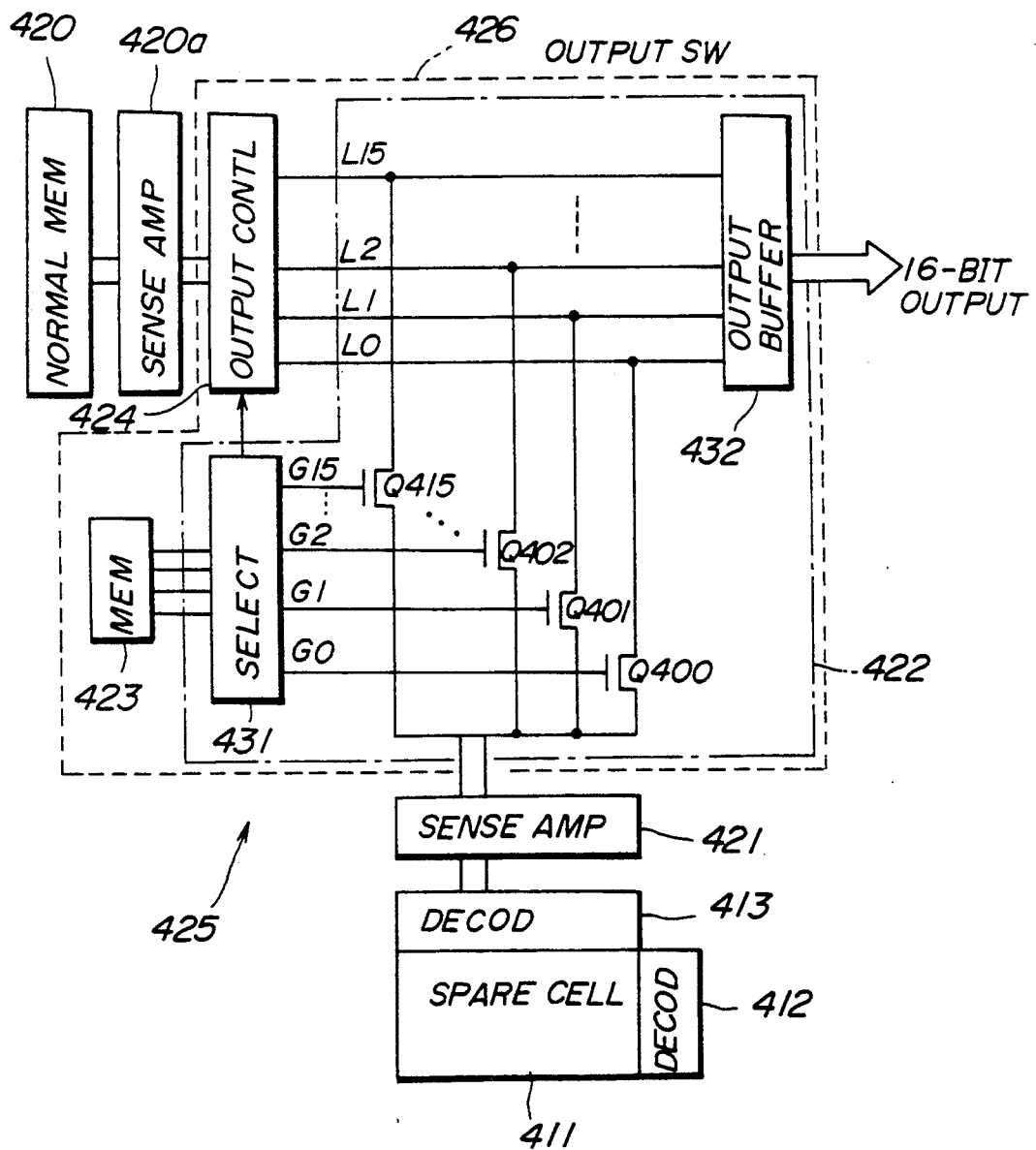
FIG. 27 is a system block diagram showing an embodiment of a switch circuit shown in FIG. 26 together with related parts of the ninth embodiment.

FIG. 27 shows an embodiment of the switch circuit 422 shown in FIG. 26 together with related parts of the ninth embodiment. The switch circuit 422 comprises a select circuit 431, an output buffer 432 and N-channel MOS transistors Q400 through Q415 for output selection. The select circuit 431 supplies gate signals G0 through G15 to the corresponding transistors Q400 through Q415 based on the select instruction from the memory 423. The gate signals G0 through G15 is used to select the bit of the 16-bit output data which is to be replaced by the data from the spare memory cell array 411. The select circuit 431 also supplies a control signal to the output control circuit 424 in synchronism with the timing which the gate signals G0 through G15 are output from the select circuit 431. The gate signals G0 through G15 have high levels when replacing the data by the data from the spare memory cell array 411.

Accordingly, the data which is obtained from the spare memory cell array 411 via the sense amplifier 421 is supplied to the output buffer 432 via the corresponding transistors Q400 through Q415 which are ON and corresponding lines L0 through L15. The lines L0 through L15 which are connected to the output buffer 432 transmit the data from the output control circuit 424. The output control circuit 424 supplies the normal data from the normal memory part 420 to the lines L0 through L15 based on the control signal which is received from the select circuit 431. In addition, the output control circuit 424 blocks the defective bit of the 16-bit data which are received from the normal memory part 420 via the sense amplifier 420a.

Figure 28:
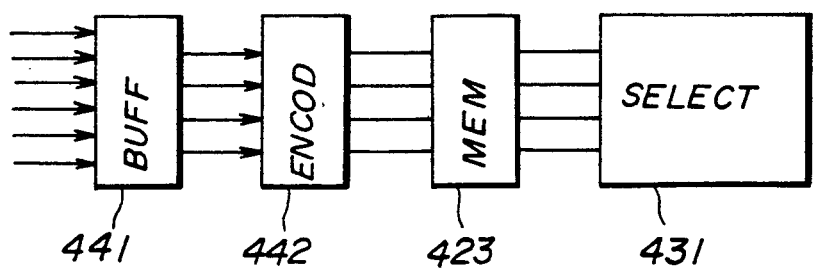
FIG. 28 is a system block diagram showing a system for storing information in a memory of the ninth embodiment.

The memory 423 stores the information which indicates which bit of the 16-bit data is to be replaced, as described before. This information is stored in the memory 423 by a method described hereunder in conjunction with FIG. 28. That is, when a defective memory cell is found within the normal memory part 420 during an output data checking stage after the production of the semiconductor memory device, for example, signals D0 through D15 which sets a selected bit to "1" and the other bits to "0" are supplied to an encoder 442 via a buffer 441. The encoder 442 generates a selection signal which is described by 4 bits B0 through B3 based on the 16 bits of signals D0 through D15 which are obtained from the buffer 441 using the logic 16 (bits)=$2^4$. The selection signal is supplied to the memory 423.

Figure 29:
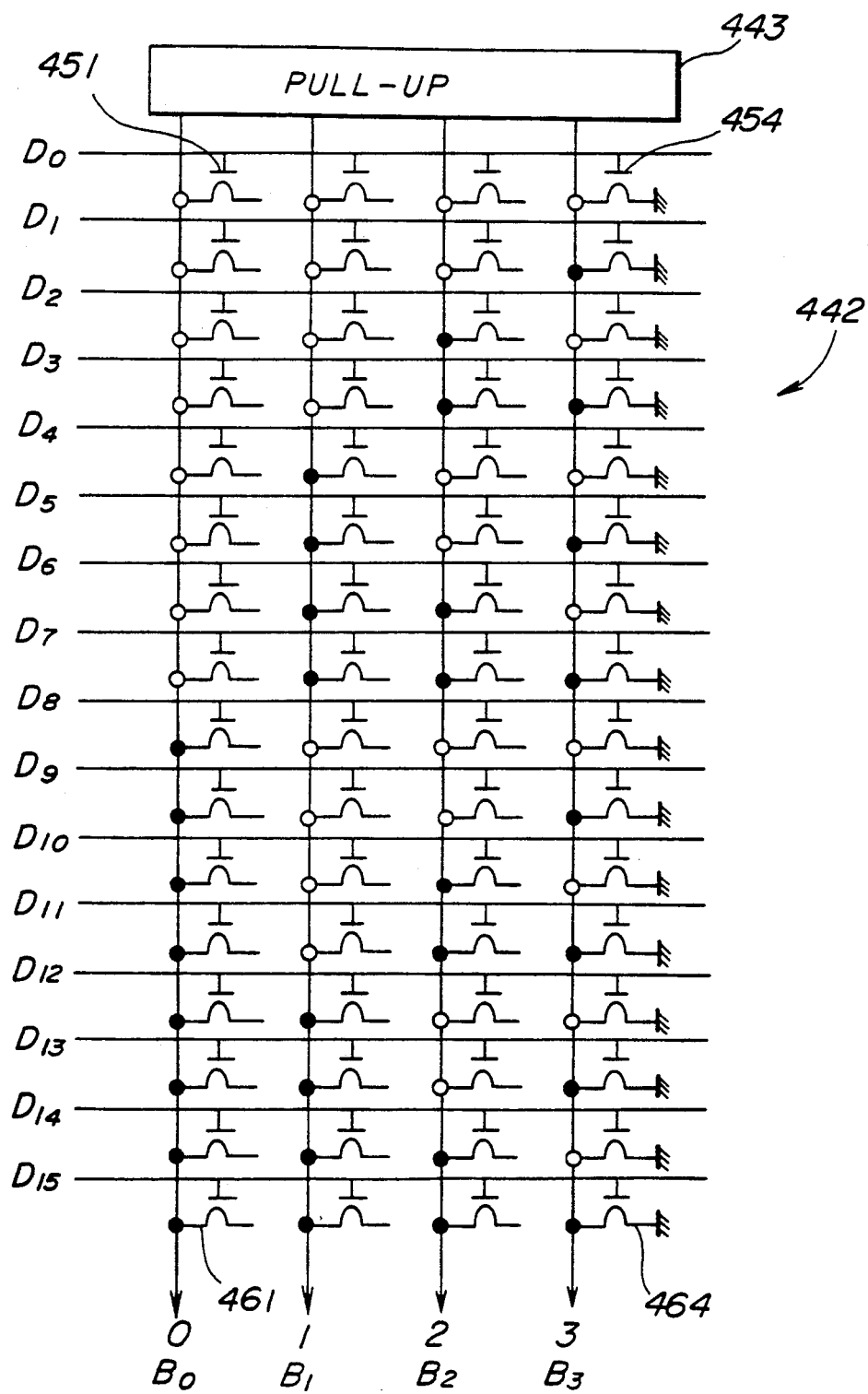
FIG. 29 is a circuit diagram showing an embodiment of an encoder of the ninth embodiment.

FIG. 29 shows an embodiment of the encoder 442. The encoder 442 comprises 64 N-channel MOS transistors 451 through 464 and a pull-up circuit 443 which supplies power source voltages to the transistors 451 through 464. In FIG. 29, only the transistors 451, 454, 461 and 464 located at the four corners are labelled so as to simplify the circuitry. In addition, one end of each of the transistors 451 through 464 is grounded, but the grounding is only shown for the transistors 454 and 464 for the sake of simplifying the drawing. Whether or not the transistors 454 through 464 are connected to the pull-up circuit 443 is indicated by the black and white circular marks. The black circular mark indicates that the transistor is connected to the pull-up circuit 443, and the white circular mark indicates that the transistor is not connected to the pull-up circuit 443. Accordingly, the encoder 442 constitutes the so-called NOR type ROM matrix, and generates selection signals B0 through B3 based on the high and low levels of the 16 bits of signals D0 through D15 which are received from the buffer 441. The selection signals B0 through B3 indicates the output bit which corresponds to the defective memory cell to be replaced by the spare memory cell. For example, when the signal D3 which corresponds to the output bit which does not need to be replaced has a high level and the other signals signals D1, D2 and D4 through D15 have low levels, B0=B1=0 and B2=B3=1.

The switch circuit 422 and the output control circuit 424 constitute a replacing circuit 425. The memory 423 and the replacing circuit 425 constitute an output switch means 426.

When a defective memory cell exists within the normal memory part 420, the address of the defective memory cell is stored in the defective address memory (not shown) when the check is made to determine whether or not the fixed data are correctly written into the normal memory part 420. During the read operation in which the data is read out from the normal memory part 420, the data from the spare memory cell array 411 is supplied to the switch circuit 422 via the sense amplifier 421. The memory 423 stores the bit or bits out of the 16-bit output of the normal memory cell array 420 which are to be replaced by the data in the spare memory cell array 411. When the bit line of the normal memory part 420 is defective, a select instruction which selects one bit corresponding to the defective bit line is stored in the memory 423 via the encoder 442, and the bit information from the memory 423 is supplied to the select circuit 431. Accordingly, the data are supplied from the normal memory part 420 to the 16-bit lines L0 through L15 via the output control circuit 424, and one of the transistors Q400 through Q415 which is connected to the line which corresponds to the defective bit line turns ON. With respect to the line which corresponds to the defective bit line and has the transistor which turns ON, the output of the output control circuit 424 is blocked. As a result, all the 16 bits which are output from the output buffer 432 are correct.

On the other hand, when the word line of the normal memory part 420 is defective, a select instruction which selects one or a plurality of bits which correspond to the defective memory cell out of the 16 bits along the word line is stored in the memory 423 via the encoder 442, and this select instruction is supplied to the select circuit 431. Accordingly, out of the gate signals G0 through G15 which are supplied to the transistors Q400 through Q415, one or a plurality of transistors which are connected to those ones of lines L0 through L15 which correspond to the defective memory cell of the word line turn ON. As a result, all of the 16 bits output from the output buffer 432 are correct as in the case where the bit line is defective.

In this embodiment, the switch circuit 422 replaces the bits from the normal memory part 420 by the bits from the spare memory cell array 411 based on the select instruction which is received from the memory 423, regardless of whether the defective memory cell exists in the word line or the bit line. For this reason, there is no need to designate the word line direction or the bit line direction as in the case of the first embodiment.

In the case of the defective bit line, only one bit out of the 16-bit output of the normal memory part 420 is replaced by the corresponding bit of the output of the spare memory cell array 411. On the other hand, in the case of the defective word line, one or more bits out of the 16-bit output of the normal memory part 420 are replaced by the corresponding bits of the output of the spare memory cell array 411. Hence, the efficiency with which the defective memory cell can be replaced by the redundant circuit is improved in that the replacement of the defective memory cells is not limited to those cells along the designated direction.

In addition, the structure of the redundant circuit is simple and there is no need to increase the capacity of the spare memory cell array 411 and make the redundant structure complex for the purpose of improving the efficiency with which the defective memory cell is replaced by the spare memory cell. Therefore, it is possible to prevent an increase of the chip area occupied by the redundant circuit and also prevent the control operation from becoming complex. Hence, the semiconductor memory device does not become expensive.

In this embodiment, the encoder 442 has the MOS transistor matrix structure and does not require logic gates using a large number of transistors. Therefore, the chip area occupied by the redundant circuit can be suppressed to a minimum.

Figure 30:
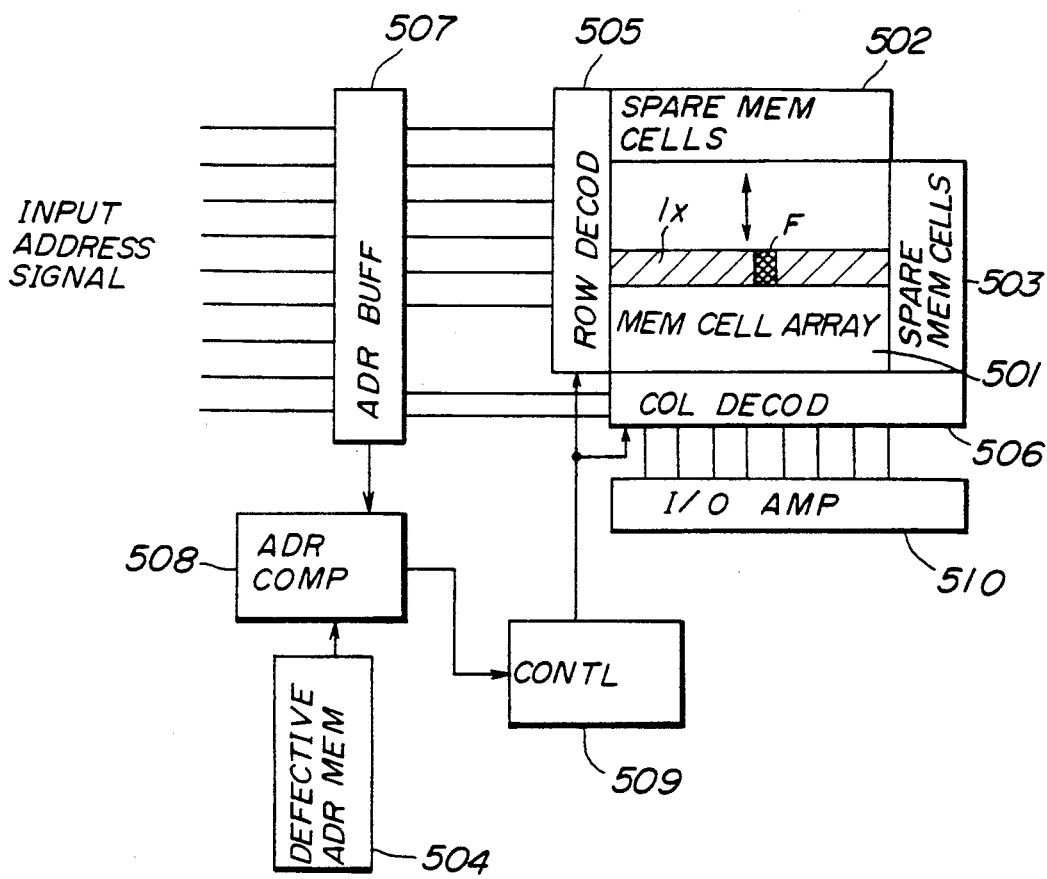
FIG. 30 is a system block diagram showing an example of a conventional SRAM for facilitating the understanding of a tenth embodiment of the semiconductor memory device according to the present invention.

Next, a description will be given of a conventional SRAM for facilitating the understanding of a tenth embodiment of the semiconductor memory device according to the present invention. FIG. 30 shows an example of the conventional SRAM in which a memory cell array 501 comprises a plurality of memory cells located at intersections of word lines and bit lines. Spare memory cells 502 are arranged along the word lines adjacent to the memory cell array 501, and spare memory cells 503 are arranged along the bit lines adjacent to the memory cell array 501. The defective memory cell is replaced in units of one row or line, and the spare memory cells 502 and 503 respectively have memory cells amounting to several spare lines. A defective line 1x which includes a defective memory cell F is replaced by a spare line by registering a defective address of the memory cell array 501 into a defective address memory 504.

The word lines of the memory cell array 501 and the word lines of the spare memory cells 502 are respectively connected to a row decoder 505. Similarly, the bit lines of the memory cell array 501 and the bit lines of the spare memory cells 503 are respectively connected to a column decoder 506. When an input address signal is supplied to an address buffer 507, this input address signal is supplied to a comparing circuit 508 wherein the input address is compared with the defective address which is registered in the defective address memory 504. The comparing circuit 508 supplies a coincidence signal to a control circuit 509 when the two compared addresses coincide.

Based on the coincidence signal, the control circuit 509 generates a decoded signal for replacing the defective line 1x by the lines of the spare memory cells 502 and 503. The decoded signal is supplied to the row decoder 505 and the column decoder 506. Accordingly, the defective word line or bit line of the memory cell array 501 is replaced by the line of the spare memory cells 502 or 503, and the data of the replaced line is output via an input/output amplifier 510. When no defective memory cell F exists in the memory cell array 501, the input address is decoded normally and the data is read out from the memory cell array 501.

Figure 31:
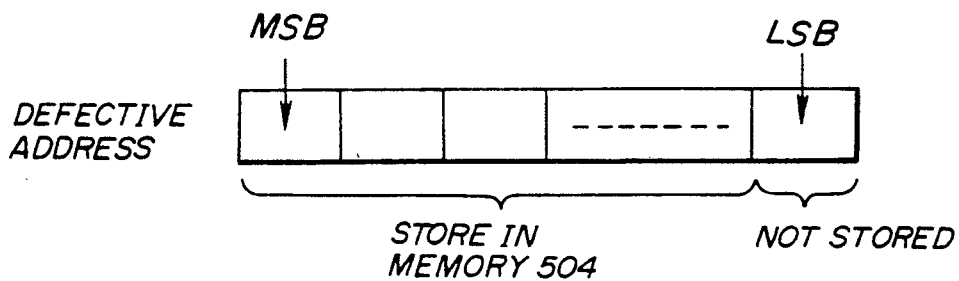
FIG. 31 is a diagram showing an address structure.

However, the defective address memory 504 stores the defective address which designates the word lines or bit lines in units of blocks (or pairs). For this reason, the least significant bit (LSB) of the address which has an address structure shown in FIG. 31 is not stored in the defective address memory 508. Therefore, when the defective portion of the memory cell array 501 spans two blocks, it is impossible to replace the defective memory cells and the reliability of the data deteriorates.

Figure 32:
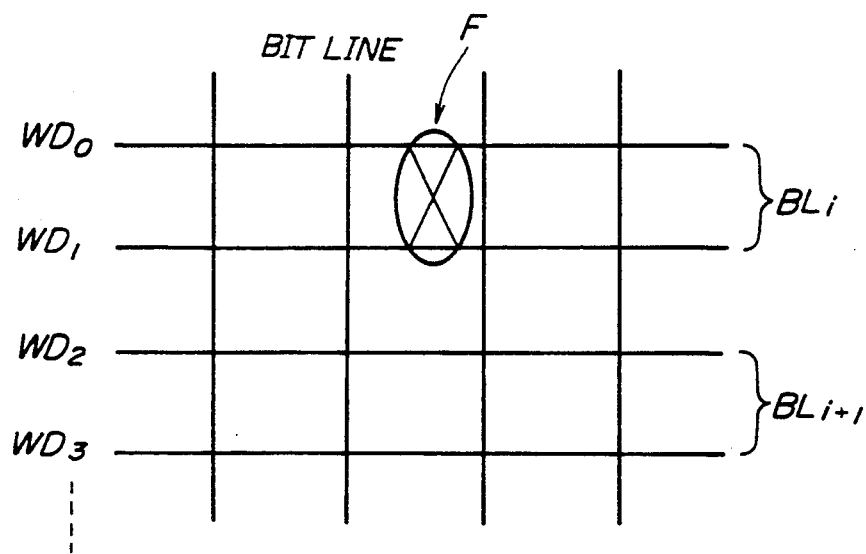
FIGS. 32 through 34 are diagrams for explaining replacement of defective portions within the SRAM shown in FIG. 30.

For example, memory cell array 501 comprises word lines WD0 through WD3 as shown in FIG. 32. If a defective portion F exists in a block BLi which is made up of the word lines WD0 and WD1, this defective portion F can be cured by use of the defective address which is stored in the defective address memory 504 even though the defective address does not include the LSB, because the defective portion F exists within the block BLi.

Figure 33:
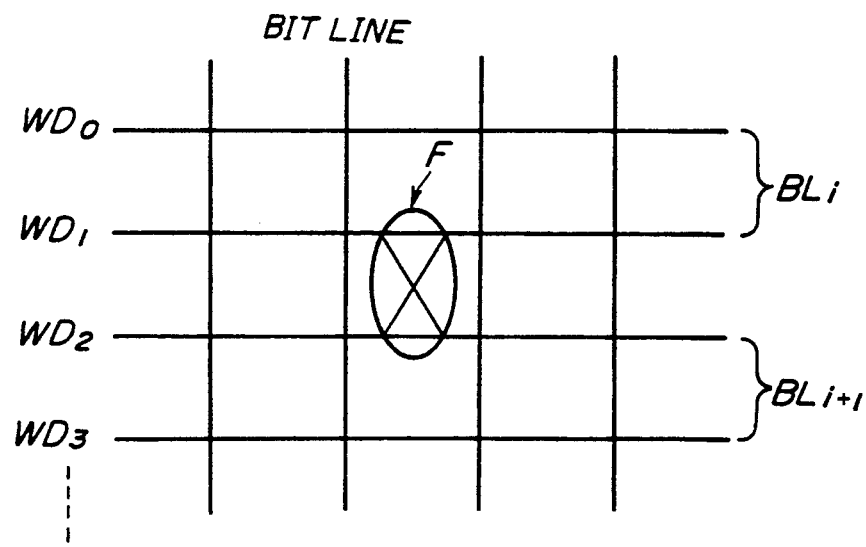
Figure 34:
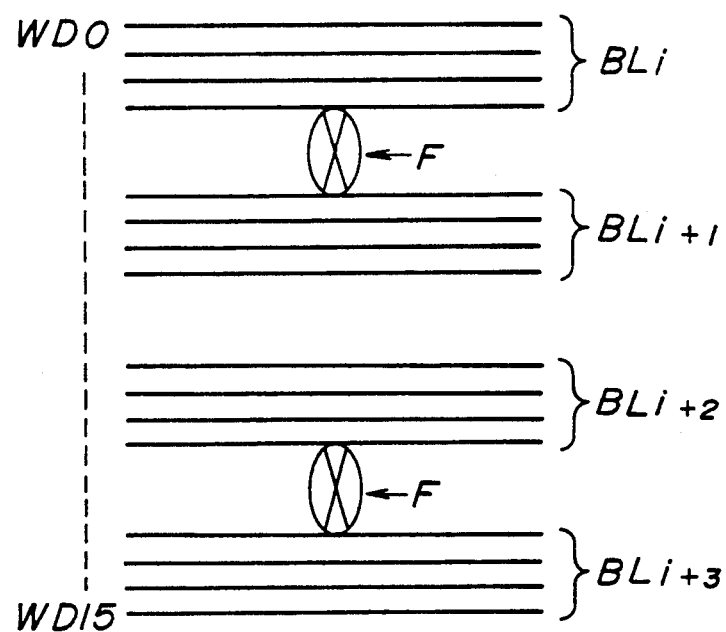

But when the defective portion F spans two blocks BLi and BLi+1 as shown in FIG. 33, the detective portion F cannot be cured by use of the defective address which only designates the defective portion F in terms of one block. Similarly, when each block is made up of four word lines and the defective portion F spans four blocks BLi, BLi+1, BLi+2 and BLi+3 as shown in FIG. 34, it is also impossible to cure the defective portion F.

Conventionally, the replacement of the defective portion is carried out in blocks by use of the redundant circuit in order to maintain a practical level. But recently, there are demands to realize a higher yield, and it is becoming necessary to cure the defective portion which spans two blocks made up of the word lines or the bit lines.

Figure 35:
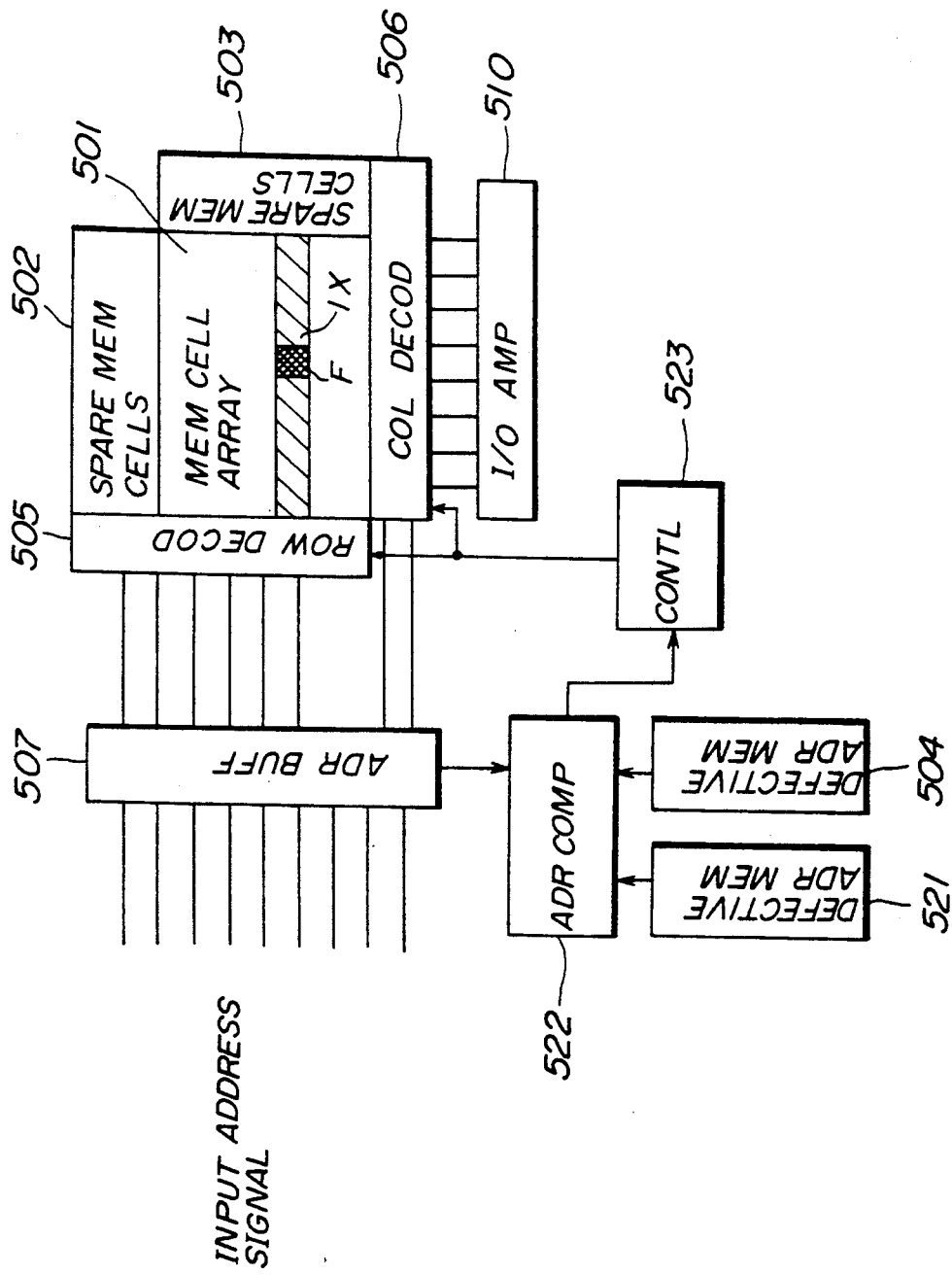
FIG. 35 is a system block diagram showing a conceivable SRAM for facilitating the understanding of the tenth embodiment.

In order to cure the defective portion which spans two blocks, a SRAM shown in FIG. 35 is conceivable. In FIG. 35, those parts which are essentially the same as those corresponding parts in FIG. 30 are designated by the same reference numerals, and a description thereof will be omitted. In FIG. 35, a second defective address memory 521 is provided to store the LSB of the defective address, and the redundant process is carried out based on the information stored in the second defective address memory 521.

Figure 36:
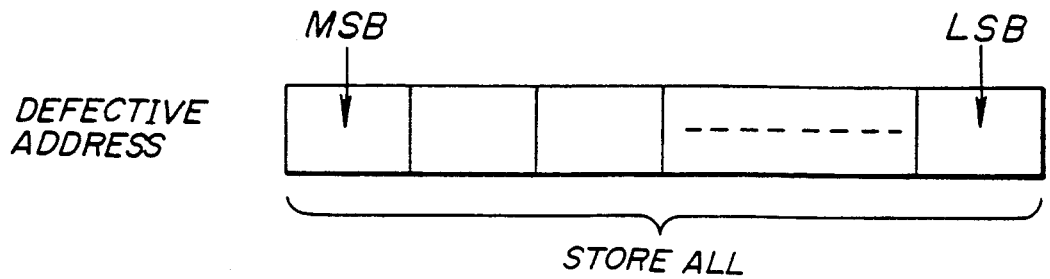
FIG. 36 is a diagram showing an address structure.

All of the bits including the LSB of the defective address shown in FIG. 36 are stored by the defective address memories 504 and 521, and it is possible to designate one word line or bit line within the memory cell array 501. Outputs of the defective address memories 504 and 521 are supplied to an address comparing circuit 522, and the address comparing circuit 522 supplies a coincidence signal to a control circuit 523 when all bits of the input address coincide with the corresponding bits of the defective address. Based on the coincidence signal, the control circuit 523 generates a decoded signal for replacing the defective line 1× by the line of the spare memory cells 502 or 503. The decoded signal is supplied to the row decoder 505 and the column decoder 506.

Figure 37:
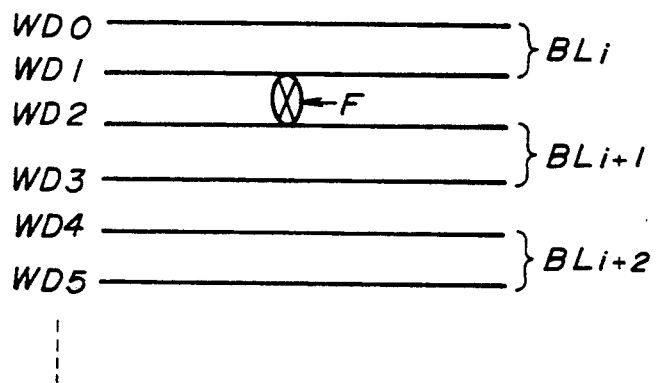
FIGS. 37 and 38 are diagrams for explaining replacement of defective portions within the SRAM shown in FIG. 35.

When the defective portion F spans the word lines WD1 and WD2 of the memory cell array 501 as shown in FIG. 37, all bits of the addresses of the word lines WD1 and WD2 are respectively stored in the defective address memories 504 and 521. The address comparing circuit 522 outputs the coincidence signal to the control circuit 523 when the input address coincides with the address of the word line WD1 or WD2, and the data from the word line WD1 or WD2 is replaced by the data from the line of the spare memory cells 502.

When the defective portion F spans two blocks BLi and BLi+1, this defective portion F cannot be cured by the conventional SRAM shown in FIG. 30 as described before in conjunction with FIG. 33. But according to the conceivable SRAM shown in FIG. 35, each of the word lines WD1 and WD2 can be specified and replaced by the line of the spare memory cells 502 because all bits of the defective address are stored. Hence, the conceivable SRAM can cure the defective portion F which spans two blocks BLi and BLi+1 such as a case where the two blocks BLi and BLi+1 are short-circuited.

Figure 38:
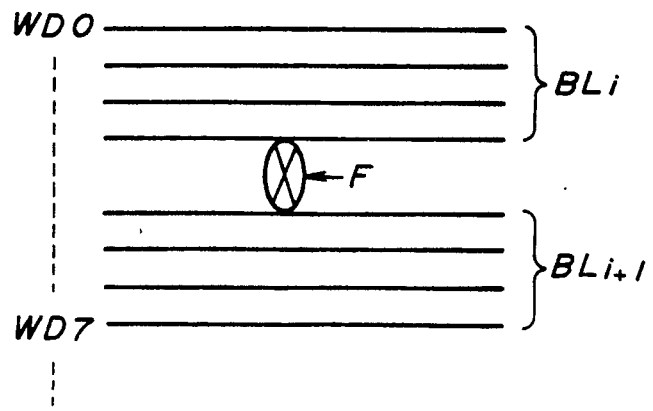

However, even in the case of the conceivable SRAM, the defective portion F between four blocks BLi, BLi+1, BLi+2 and BLi+3 (only BLi and BLi+1 shown) shown in FIG. 38 cannot be cured when each block is made up of four word lines, for example.

Figure 39:
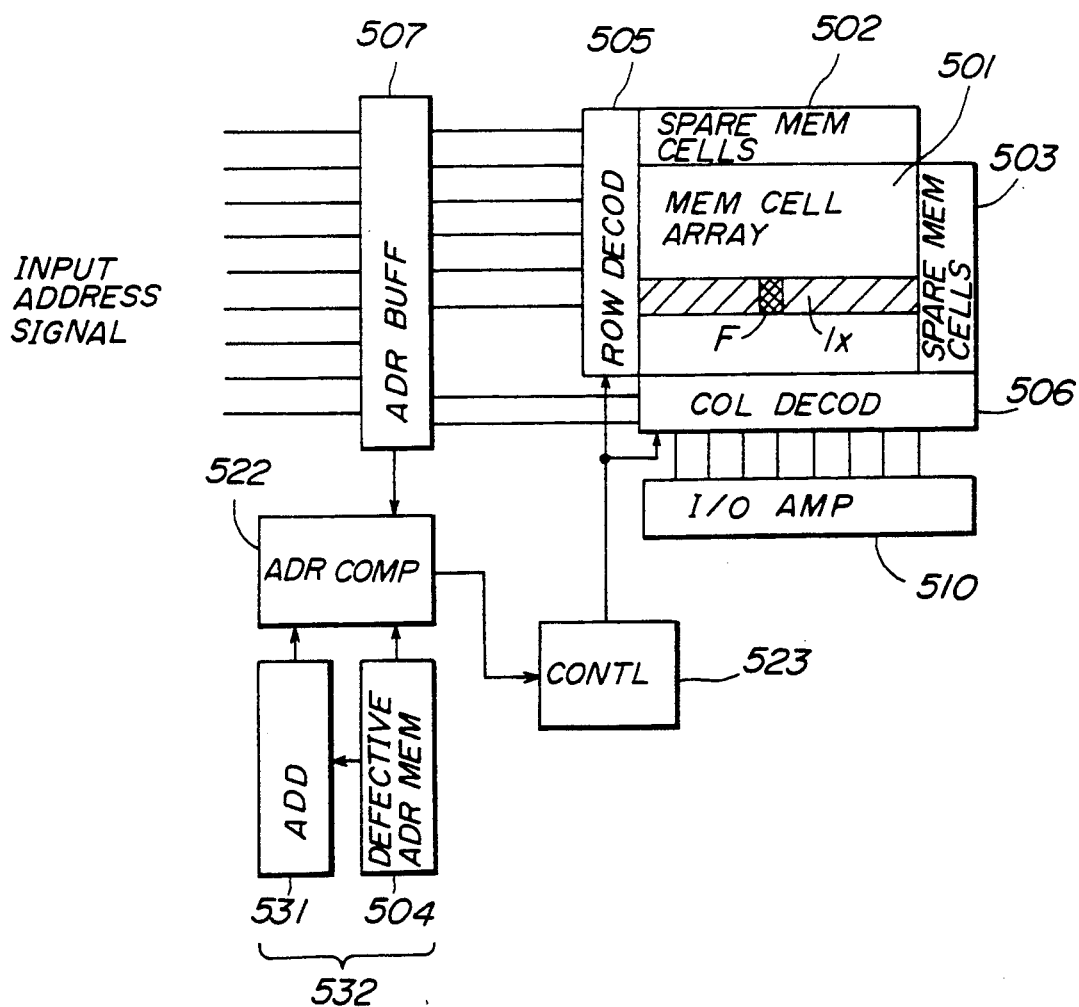
FIG. 39 is a system block diagram showing an essential part of the tenth embodiment.

Next, a description will be given of the tenth embodiment of the semiconductor memory device according to the present invention, in which the above described problems are eliminated. FIG. 39 shows an essential part of the tenth embodiment. In FIG. 39, those parts which are essentially the same as those corresponding parts in FIG. 30 are designated by the same reference numerals, and a description thereof will be omitted.

In this embodiment, an adder 531 is provided as shown in FIG. 39. This adder 531 increments the address which is stored in the defective address memory 504 and supplies the incremented address to the address comparing circuit 522. The address comparing circuit 522 supplies a coincidence signal to the control circuit 523 when the input address coincides with either one of the addresses received from the defective address memory 504 and the adder 531. The control circuit 523 generates a control signal responsive to the coincidence signal so that the defective line 1× is replaced by the line of the spare memory cells 502 or 503.

By storing all bits of the defective address in the defective address memory 504 as shown in FIG. 40A, it is possible to replace the defective portion by taking one line as one block. In addition, when two lines are designated as one block as shown in FIG. 40B and the address is incremented by the adder 531, it is possible to replace the defective portion which spans two blocks. Similarly, when four lines are designated as one block and the address incremented as shown in FIG. 40C, it is possible to replace the defective portion which spans two blocks.

Therefore, when one or a plurality of lines are designated as one block by the defective address memory 504 and another block is designated by the adder 531, it is not only possible to replace the defective portion within the block but also replace the defective portion which spans two blocks. Furthermore, the adder 531 is not limited to incrementing the address by one but may add an arbitrary integer n to the address.

Figure 41:
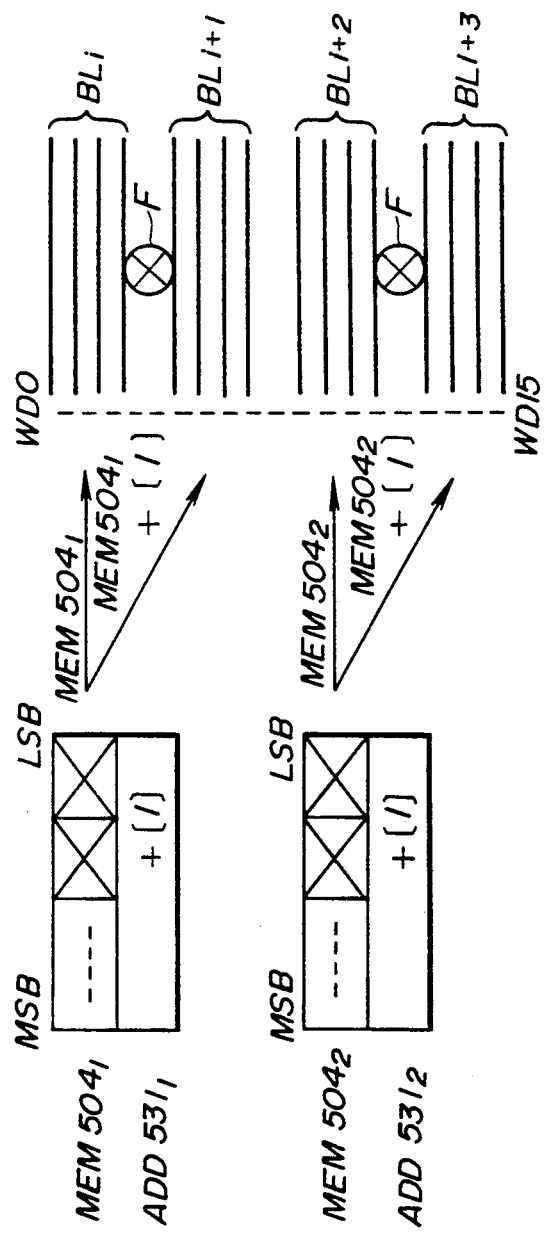

When eliminating the problem described before in conjunction with FIG. 38, the defective address memory 504 designates a block which comprises four lines and the adder 531 designates a block which also comprises four lines by incrementing the address stored in the defective address memory 504, as shown in FIG. 41. In FIG. 41, the defective address memory 504 is shown as memory parts 504₁ and 504₂ and the adder 531 is shown as adder parts 531₁ and 531₂ for the sake of convenience to illustrate parts which respectively designate the two blocks.

According to this embodiment, it is possible to designate other blocks when one block is designated. The defective portion can be replaced positively even when the defective portion spans four blocks, for example. Further, the bit line defects can be cured similarly although the description above only describes curing the word line defects.

In addition, the application of this embodiment is not limited to the SRAM and is applicable to any type of memory which has a redundant structure. For example, this embodiment is applicable to the DRAM, EPROM, and mask ROM. Of course, in the case of the mask ROM, a decoding system provided with respect to the spare memory cells is independent of the decoding system provided with respect to the normal memory cells.

Figure 42:
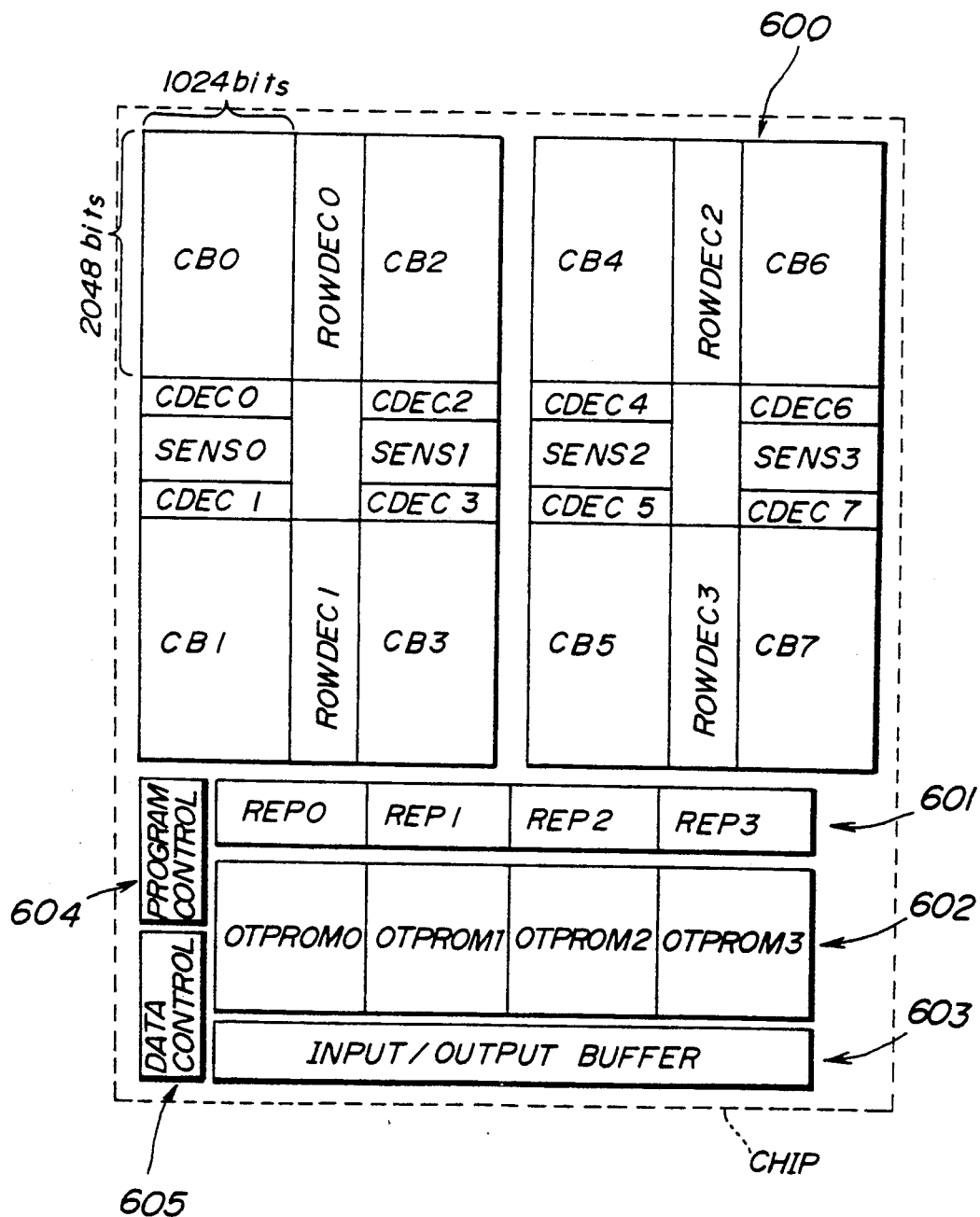
FIG. 42 is a plan view generally showing an arrangement of circuit parts of an eleventh embodiment of the semiconductor memory device on a chip.

FIG. 42 shows an arrangement of circuit parts of an eleventh embodiment of the semiconductor memory device on a chip. A 2 Mbit mask ROM cell array 600, a replacement part 601, a 4 kbit one time programmable ROM (OTPROM) cell array 602, an input/output buffer 603, a program control circuit 604 and a data control circuit 605 are arranged as shown in FIG. 42. The mask ROM cell array 600 comprises cell blocks CB0 through CB7, column decoders CDEC0 through CDEC7, row decoders ROWDEC0 through ROWDEC3, and sense amplifiers SENS0 through SENS3. The cell blocks CB0 through CB7 respectively have a memory capacity of 2048 bits×1024 bits. The OTPROM cell array 602 comprises OTPROMs OTPROM0 through OTPROM3 which respectively have a memory capacity of 512 bits×16 bits. According to the arrangement (layout) shown in FIG. 42, the semiconductor memory device occupies a small chip area and a high-speed operation of the memory can be realized despite the relatively complex circuit construction.

FIG. 43 shows a system block diagram of the eleventh embodiment. In FIG. 43, those parts which are the same as those corresponding parts in FIG. 42 are designated by the same reference numerals, and a description thereof will be omitted. The replacement part 601 comprises four replacement address memories 611 and four address comparing circuits 612. Input address bits A00 through A19 are supplied to an address buffer 610, and data bits D0 through D15 are input and output via the input/output buffer 603. The program control circuit receives external signals $\overline{BYTE}$, $\overline{CE}$ and $\overline{OE}$.

During the read operation, the input address is compared with the address stored in the replacement address memories 611, and the data is output from the mask ROM cell array 600 or the OTPROM cell array 602 depending on whether or not the compared addresses coincide. During the write operation, the replacement address information is stored in the replacement address memories 611 and the replacement data are stored in the OTPROM cell array 602 under the control of the signals $\overline{BYTE}$, $\overline{CE}$ and $\overline{OE}$.

FIG. 44 shows a function table of the eleventh embodiment. In FIG. 44, Vpp denotes a power source voltage of 15 V, L denotes a low level, H denotes a high level, and HH denotes a level which is higher than Vcc. In the case "1" where $\overline{BYTE}$=Vpp, $\overline{CE}$=HH, $\overline{OE}$=HH and data bits D0 through D15 are all L, the address bits A09 through A19 of the replacement portion can be programmed in the replacement address memories 611. One replacement address memory 611 is selected by the address bits A6 and A7. In the case "2" where $\overline{BYTE}$=Vpp, $\overline{CE}$=L, and $\overline{OE}$=HH, the data is programmed into the OTPROM cell array 602 by successively increasing the address value indicated by the address bits A00 through A08. In the case "3" where $\overline{BYTE}$=Vpp, $\overline{CE}$=HH, $\overline{OE}$=HH, and the data bits D0 through D15 are all L, a write protect command is programmed. After the write protect command is programmed, the semiconductor memory device refuses to accept a programming operation so as to prevent a mis-programming of the replacement address memories 611 and the OTPROM cell array 602 during the read operation. The case "4" is similar to the case "1" except that the replacement address memory programming is carried out for the bit line replacement rather than the word line replacement.

FIG. 45 shows an address assignment used in the eleventh embodiment. The address bits A00 through A04 are used to designate the column, the address bits A05 through A16 are used to designate the row, and the address bits A17 through A19 are used to designate the cell block. In FIG. 45, "*" denotes two storages per replacement and "+" denotes one storage per replacement.

Figure 46:
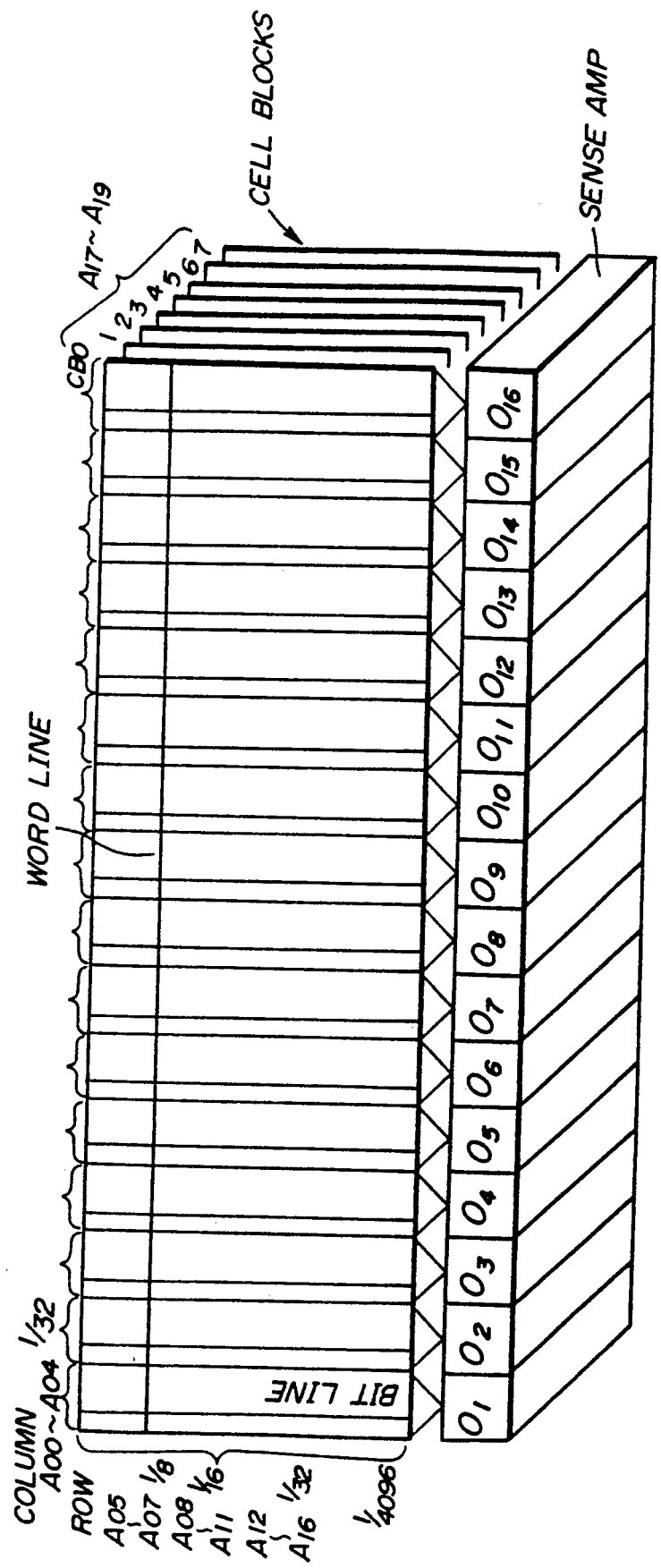
FIG. 46 is a schematic diagram for facilitating the understanding of the address designation and cell block designation.

FIG. 46 is a schematic diagram for facilitating the understanding of the address designation and cell block designation. It can be seen from FIG. 46 that the columns of the mask ROM cell array 600 are designated by the address bits A00 through A04, the rows of the mask ROM cell array 600 are designated by the address bits A05 through A16, and the cell blocks CB0 through CB7 are designated by the address bits A17 through A19.

Figure 47:
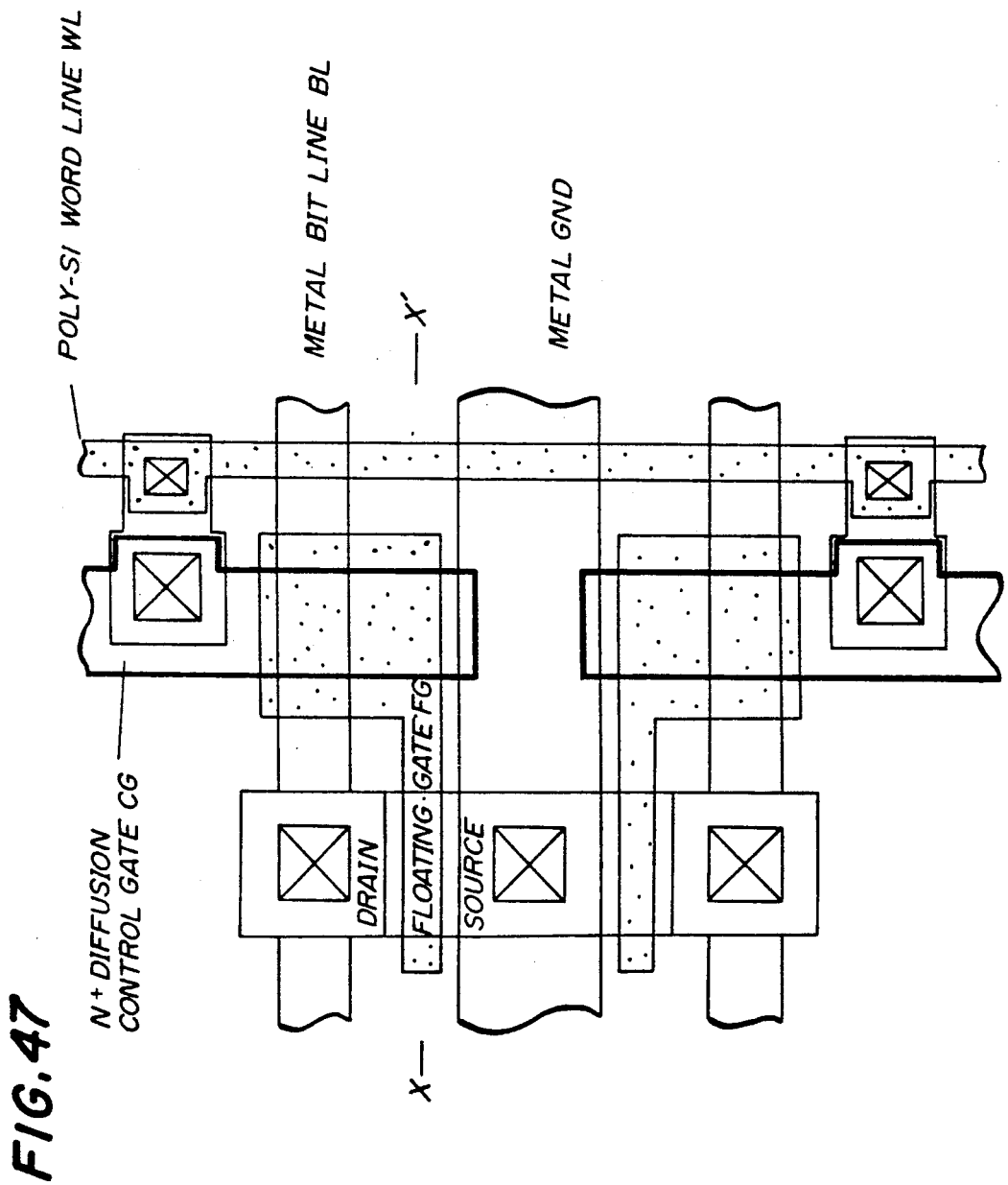
FIG. 47 is a plan view showing single polysilicon EPROM cells which constitute each of the OTPROMs OTPROM0 through OTPROM3 of the eleventh embodiment.
Figure 48:
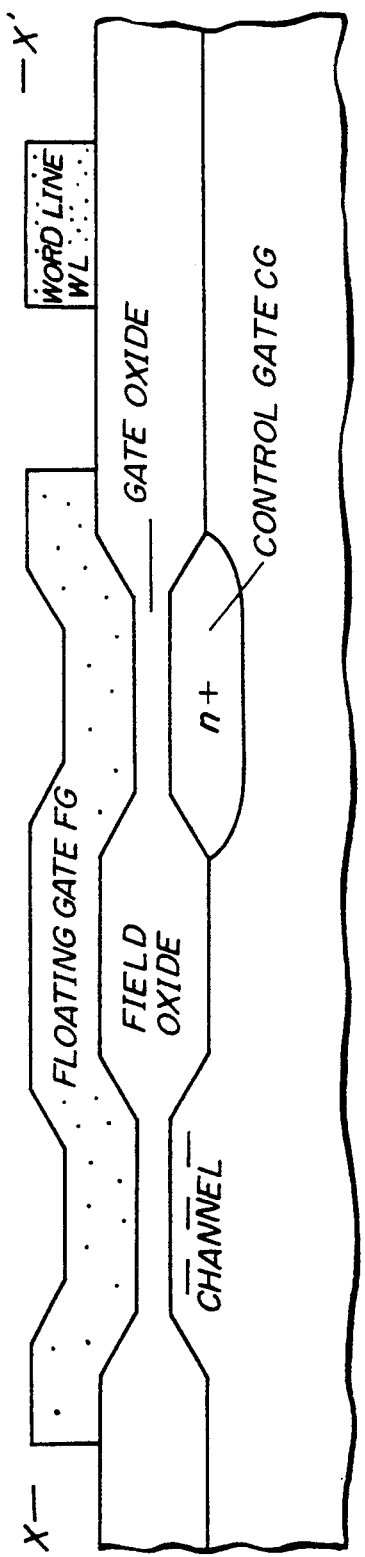
FIG. 48 is a cross sectional view showing the EPROM cells shown in FIG. 47 along a line X—X'.

FIG. 47 shows a plan view of single polysilicon EPROM cells which constitute each of the OTPROMs OTPROM0 through OTPROM3. FIG. 48 is a cross sectional view of the EPROM cells shown in FIG. 47 along a line X—X'. In FIGS. 47 and 48, each EPROM cell has a cell size of 16×10 μm². A word line WL is made of a polysilicon layer, and a bit line BL and a ground interconnection GND are respectively made of a metal layer. A control gate CG is made of a diffusion layer which connects to the word line WL. A floating gate FG is made of a polysilicon layer.

Further, the present invention is not limited to these embodiments, but various variations and modifications may be made without departing from the scope of the present invention.

What is claimed is:

1. A semiconductor memory device, comprising:
   first memory means being a first type of memory which includes memory cells for prestoring fixed data;
   decoder means for decoding an input address and for reading out a fixed data from said first memory means based on a decoded input address;
   second memory means being a second type of memory for storing a data identical to that prestored in a defective memory cell of said first memory means, wherein said second memory means can replace a defective memory cell within said first memory means, and includes programmable nonvolatile memory cells;
   discriminating means operably connected to said first memory means including third memory means for storing a redundant address corresponding to each defective memory cell of said first memory means, wherein said discriminating means discriminates whether or not the input address coincides with the redundant address and outputs a discrimination signal when the input address coincides with the redundant address; and selecting means operably connected to said first and second memory means, said selecting means being supplied with data read out from said first and second memory means for normally outputting the data read out from said first memory means and for selectively outputting the data from said second memory means when the discrimination signal is received from said discriminating means.

2. The semiconductor memory device as claimed in claim 1 wherein, said first memory means comprises a mask read only memory cell array, and said second memory means comprises a programmable read only memory cell array.

3. The semiconductor memory device as claimed in claim 1 wherein, said third memory means comprises a first memory for storing a redundant address of each row or column which includes the defective memory cell of said first memory means and a second memory for storing a direction information which designates a replacing direction in which the defective memory cell of said first memory means is to be replaced, an address switch means for selectively extracting an address for decoding to be used in the second memory means and an address for discriminating the replacement of the defective memory cell in the first memory means when the input address includes the defective address based on the direction information which is obtained from the second memory.

4. The semiconductor memory device as claimed in claim 1 wherein, said first memory means comprises a plurality of cell blocks respectively having a plurality of memory cells, each of said cell blocks outputting a multi-bit data when designated by the input address, said discriminating means outputting a discrimination signal when the input address coincides with a redundant address of the defective memory cell within one of the cell blocks.

5. The semiconductor memory device as claimed in claim 4 wherein, the memory cells of said first memory means are respectively coupled to a corresponding one of word lines and a corresponding one of bit lines, and only one word line of an arbitrary cell block is activated when the arbitrary memory cell thereof is designated by the input address.

6. The semiconductor memory device as claimed in claim 1 wherein, the memory cells of said second memory means are respectively coupled to a corresponding one of word lines and a corresponding one of bit lines, each memory cell of said second memory means comprising a first metal insulator semiconductor transistor having one of a source and a drain connected to one bit line and a first capacitor having a first electrode connected to a gate of said first metal insulator semiconductor transistor and a second electrode connected to one word line.

7. The semiconductor memory device as claimed in claim 6 wherein, each memory cell of said third memory means comprises a second metal insulator semiconductor transistor and a second capacitor having one electrode connected to a gate of said second metal insulator semiconductor transistor.

8. The semiconductor memory device as claimed in claim 6 wherein, said first memory means comprises a mask read only memory cell array.

9. The semiconductor memory device as claimed in claim 6 wherein, the memory cells of said first memory means are arranged with a first pitch, and the memory cells of said second memory means are arranged with a second pitch, said first pitch being smaller than said second pitch.

10. The semiconductor memory device as claimed in claim 9 wherein, the memory cells of said second memory means are arranged in series as m columns which are parallel to the bit lines, each column comprising 1/n a number of memory cells in a corresponding column of said first memory means, m and n being arbitrary integers.

11. The semiconductor memory device as claimed in claim 9 wherein, the memory cells of said second memory means are arranged in series as M rows which are parallel to the word lines, each row comprising 1/N a number of memory cells in a corresponding row of said first memory means, M and N being arbitrary integers.

12. The semiconductor memory device as claimed in claim 1 wherein, said first memory means comprises a plurality of memory cells which are arranged in rows and columns and outputs a multi-bit data when designated by the input address, said third memory means stores a redundant address of each row or column of said first memory means which includes a defective memory cell of said first memory means, and said selecting means replaces at least a portion of the data read out from said first memory means by a corresponding portion of the data from said second memory means when the discrimination signal is received from said discriminating means.

13. The semiconductor memory device as claimed in claim 12 wherein, said selecting means comprises bit storage means for storing predetermined bits of the data read out from said first memory means and to be replaced, and replacement means for replacing the predetermined bits of the data read out from said first memory means by corresponding bits of the data from said second memory means when the discrimination signal is received from said discriminating means based on the predetermined bits stored in said bit storage means.

14. The semiconductor memory device as claimed in claim 1 wherein, said first memory means comprises a plurality of memory cells which are arranged in rows and columns, said third memory means stores a redundant address of rows and columns of said first memory means which include a defective memory cell, and said selecting means replaces the data read out from said first memory means by the data from at least one of a corresponding row and column of said second memory means when the redundant address spans two adjacent rows or columns of said first memory means and the discrimination signal is received from said discriminating means.

15. The semiconductor memory device as claimed in claim 14 wherein, said discriminating means includes adding means for adding an integer L to the redundant address stored in said third memory means, and comparing means for outputting the discrimination signal when the input address coincides with one of the addresses received from said adding means and said third memory means.

16. The semiconductor memory device as claimed in claim 15 wherein, the addresses which are output from said third memory means and said adding means respectively designate one block, each block being made up of at least one row of said first memory means.

17. The semiconductor memory device as claimed in claim 15 wherein, the addresses which are output from said third memory means and said adding means respectively designate one block, each block being made up of at least one column of said first memory means.

18. The semiconductor memory device as claimed in claim 14 wherein, said first memory means comprises a mask read only memory cell array.

19. The semiconductor memory device as claimed in claim 14 wherein, said first memory means comprises a memory cell array selected from a group which includes a dynamic random access memory, an erasable programmable read only memory and a mask read only memory.

20. A semiconductor memory device, comprising:
  first memory means including memory cells for prestoring fixed data;
  decoder means for decoding an input address and for reading out a fixed data from said first memory means based on a decoded input address;
  second memory means for storing a data identical to that prestored in a defective memory cell of said first memory means, wherein said second memory means includes programmable non-volatile memory cells;
  discriminating means including third memory means for storing a redundant address corresponding to each defective memory cell of said first memory means for discriminating whether or not the input address coincides with the redundant address and for outputting a discrimination signal when the input address coincides with the redundant address; and
  selecting means supplied with data read out from said first and second memory means for normally outputting the data read out from said first memory means and for selectively outputting the data from said second memory means when the discrimination signal is received from said discriminating means,
  wherein said first memory means comprises a plurality of memory cells which are arranged in rows and columns, said third memory means storing a redundant address of rows and columns of said first memory means which include a defective memory cell, and said selecting means replacing the data read out from said first memory means by the data from at least one of a corresponding row and column of said second memory means when the redundant address spans two adjacent rows or columns of said first memory means and the discrimination signal is received from said discriminating means, and
  wherein said discriminating means includes adding means for adding an integer L to the redundant address stored in said third memory means, and comparing means for outputting the discrimination signal when the input address coincides with one of the addresses received from said adding means and said third memory means.

21. The semiconductor memory device as claimed in claim 20, wherein the addresses which are output from said third memory means and said adding means respectively designate one block, each block being made up of at least one row of said first memory means.

22. The semiconductor memory device as claimed in claim 20, wherein the addresses which are output from said third memory means and said adding means respectively designate one block, each block being made up of at least one column of said first memory means.

* * * * *